United States Patent
Suzuki et al.

(10) Patent No.: US 8,259,275 B2
(45) Date of Patent: Sep. 4, 2012

(54) LIQUID CRYSTAL DISPLAY DEVICE AND PROCESS OF MANUFACTURE

(75) Inventors: Takaaki Suzuki, Kasama (JP); Takuya Takahashi, Hitachi (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 590 days.

(21) Appl. No.: 12/540,400

(22) Filed: Aug. 13, 2009

(65) Prior Publication Data

US 2010/0060839 A1    Mar. 11, 2010

(30) Foreign Application Priority Data

Sep. 11, 2008    (JP) .................................. 2008-232893

(51) Int. Cl.
*G02F 1/1343*    (2006.01)
(52) U.S. Cl. ...................... 349/147; 349/139; 349/141
(58) Field of Classification Search .................. 349/147, 349/139, 141
See application file for complete search history.

(56) References Cited

U.S. PATENT DOCUMENTS

| | | | |
|---|---|---|---|
| 6,731,364 B2 | 5/2004 | Takahashi et al. | |
| 7,439,543 B2 * | 10/2008 | Yamazaki | 257/66 |
| 7,564,059 B2 * | 7/2009 | Yamazaki | 257/72 |
| 7,588,835 B2 * | 9/2009 | Yamashita et al. | 428/607 |

FOREIGN PATENT DOCUMENTS

JP    2000-165002    6/2000

OTHER PUBLICATIONS

Wen-Ching Tsai et al., "22.3: A Novel Barrierless Cu Gate for TFT-LCD", pp. 1181-1184, vol. 37, SID International Symposium Digest of Technical Papers, Jun. 2006.

* cited by examiner

*Primary Examiner* — Mike Qi
(74) *Attorney, Agent, or Firm* — Antonelli, Terry, Stout & Kraus, LLP.

(57) ABSTRACT

Provided is a liquid crystal display device capable of significantly reducing occurrence of a failure such as an interlayer short-circuit. In the liquid crystal device, a first layer formed of a copper film having a purity of 99.5% or more and a second layer formed of an alloy film containing copper as a main component are successively formed on a glass substrate or a substrate on which a transparent conductive film containing indium is formed. The alloy film serving as the second layer is made of an alloy containing copper as a main component, which has a higher etching rate in a wet etching process compared with that of copper. Accordingly, a patterned cross-section of the copper film having a large film thickness can be etched in a tapered shape, to thereby improve coverage of an insulating film or the like laminated on a wiring pattern.

12 Claims, 26 Drawing Sheets

LIQUID CRYSTAL DISPLAY DEVICE AND PROCESS OF MANUFACTURE

CROSS-REFERENCE TO RELATED APPLICATION

The present application claims priority from Japanese application JP 2008-232893 filed on Sep. 11, 2008, the content of which is hereby incorporated by reference into this application.

BACKGROUND OF THE INVENTION

1. Field of the Invention

The present invention relates to a liquid crystal display device driven by a thin film transistor, and to a method of manufacturing the same.

2. Description of the Related Art

As to an image display device capable of reducing its size and weight as well as obtaining high definition, a market for a thin film transistor liquid crystal device (TFT-LCD) has been expanded. In recent years, along with increasing screen size, higher definition, and higher-speed driving of the TFT-LCD, a wiring material with lower resistivity is used. Moreover, a reduction in manufacturing cost has been strongly demanded for accommodating a lower price.

The wiring material has been shifted from chromium or molybdenum to aluminum along with a reduction in resistance, and currently, a molybdenum/aluminum/molybdenum laminated-film structure in which molybdenum or a molybdenum alloy is used for a cap layer or a barrier layer is a mainstream. However, a resistivity of pure aluminum is about 3 $\mu\Omega$cm, which imposes a limitation on a further reduction in resistivity. For example, making a thicker film made of aluminum involves problems such as a dramatic increase in frequency of occurrence of hillocks which cause defects, in addition to increased tact time in a film formation step.

In addition, as a barrier cap film, a film made of expensive molybdenum is necessary for an upper layer and a lower layer made of aluminum, which increases material costs. As a wiring material having a resistivity lower than that of aluminum, copper is conceivable. A thin film made of copper has a resistivity as low as about 2 $\mu\Omega$cm. However, there are several problems when copper is used for wiring. For example, copper has a low adhesion force with a base, or unnecessarily diffuses into silicon forming a thin film transistor, leading to deterioration of transistor characteristics.

In order to alleviate the above-mentioned defects, there is proposed, in Wen-Ching Tsai et al., pp. 1181-1184, Volume 37, SID International Symposium Digest of Technical Papers, 2006, a wiring structure in which a film made of a copper alloy is disposed between copper wiring and a base material to secure an adhesion force with a base. Further, our preliminary study reveals that an adhesion force with a base is secured when porous copper is disposed between the copper wiring and the base substrate.

SUMMARY OF THE INVENTION

Also in the case of copper (Cu) having a low resistivity, along with higher performance such as improvement in motion picture quality, it is conceivable to make a thicker film made of pure copper as a technique of taking advantage of the natural low resistivity of copper. However, as a result of making a thicker film, there arises a problem that a patterned cross-section of copper wiring is likely to have a shape substantially perpendicular to the substrate. As a result, coverage of an insulating film laminated thereon becomes insufficient, and thus a defect such as an interlayer short-circuit is caused, leading to a decrease in yield.

The structure in which a film made of a copper alloy is disposed in the lower layer is disclosed by Wen-Ching Tsai et al. However, in some cases, an etching rate of a copper alloy increases depending on additive metal forming a copper alloy. In the case where an etching rate of the lower layer is higher than an etching rate of the upper layer, the lower layer is dissolved in preference to the upper layer, and hence the patterned cross-section has a contrary tapered shape.

With the processed shape as described above, coverage of, for example, the insulating film laminated on the wiring pattern is deteriorated, whereby a defect such as an interlayer short-circuit occurs frequently. Therefore, it is necessary to etch the patterned cross-section into a tapered shape.

It is an object of the present invention to provide a liquid crystal display device and a method of manufacturing the same, which are capable of etching a patterned cross-section of a film made of copper having a large film thickness into a tapered shape, and enhancing coverage of, for example, an insulating film laminated on a wiring pattern, to thereby reduce occurrence of a failure such as an interlayer short-circuit.

In order to solve the above-mentioned problems, a liquid crystal display device according to the present invention includes a thin film transistor substrate for controlling alignment of liquid crystal, in which a part of wiring of the thin film transistor substrate includes: a first layer formed of a copper film made of pure copper having a purity of at least 99.5%; and a second layer formed of an alloy film containing copper as a main component and having a higher etching rate in a wet etching process compared with that of the first layer, the second layer being provided on the first layer.

As a way of etching the patterned cross-section of the copper wiring as described above to have larger film thickness, into a tapered shape, according to the present invention, the wiring structure is formed of a laminated film including the first layer serving as a lower layer and the second layer which is formed on the first layer and serves as an upper surface. A film made of copper having a purity of at least 99.5% is disposed as the first layer, and an alloy containing copper as a main component, which has a higher etching rate compared with that of pure copper of the first layer, is disposed as the second layer.

In a case where metal is dissolved in an etchant, an etching rate of the metal increases when the solubility of an oxide of the metal is high. For this reason, when an oxide of an additive element of a copper alloy has a higher solubility compared with that of a copper oxide, a copper alloy having a higher etching rate compared with that of copper can be obtained.

The copper alloy is thinly disposed on an upper layer made of pure copper which has a large film thickness, and is processed by wet etching, whereby a pattern cross-section having a tapered shape can be obtained. The solubility of an oxide of metal corresponds to a function of pH, and hence an additive metal of the copper alloy needs to be determined in consideration of pH of the etchant.

Note that solubility of a metal oxide as pH function is described in, for example, Atlas of Electrochemical Equilibria in Aqueous Solutions, National Association of Corrosion Engineers (1974).

Further, in order to solve the above-mentioned problems, according to the present invention, a method of manufacturing a liquid crystal display device including a thin film transistor substrate which controls alignment of liquid crystal, includes: forming a first layer formed of a copper film having a purity of at least 99.5% and a second layer formed of an alloy film containing copper as a main component in a successive manner to form a laminated film, for forming a scanning signal line and a gate electrode; forming a film made of silicon nitride which serves as a gate insulating film, and forming a semiconductor layer by forming an amorphous silicon film and an $n^+$ amorphous silicon film in a successive manner; forming an image signal line, a drain electrode, and a source electrode, which are each formed of a metal film; forming a film made of silicon nitride serving as a protective insulating film, and opening a through hole in the protective insulating film and in the gate insulating film; and forming a transparent conductive film to complete a pixel electrode, in which the laminated film of the first layer and the second layer is subjected to etching with an etchant having a pH in a range smaller than 7.0.

Further, in order to solve the above-mentioned problems, according to the present invention, a method of manufacturing an in-plane-switching system liquid crystal display device including a thin film transistor substrate which controls alignment of liquid crystal, includes: forming a transparent conductive film containing an indium oxide as a main component, a first layer formed of a copper film having a purity of at least 99.5%, and a second layer formed of an alloy film containing copper as a main component in a successive manner to form a laminated film, for forming a scanning signal line, a gate electrode, a common signal line, and a common electrode; forming a film made of silicon nitride serving as a gate insulating film, and forming a semiconductor layer by forming an amorphous silicon film and an $n^+$ amorphous silicon film in a successive manner; forming a metal film for forming an image signal line, a drain electrode, and a source electrode; forming a film made of silicon nitride serving as a protective insulating film, and opening a through hole in the protective insulating film and in the gate insulating film; and forming the transparent conductive film to complete a pixel electrode, in which the laminated film of the copper film having the purity of at least 99.5% and the alloy film containing copper as the main component is subjected to etching with an etchant having a pH within a range of 1.8 to 7.0.

Further, in order to solve the above-mentioned problems, according to the present invention, a method of manufacturing a liquid crystal display device including a thin film transistor substrate which controls alignment of liquid crystal, includes: forming a first layer formed of a copper film having a purity of at least 99.5% and a second layer formed of an alloy film containing copper as a main component in a successive manner to form a laminated film, for forming a scanning signal line and a gate electrode; forming a film made of silicon nitride which serves as a gate insulating film, and forming a semiconductor layer by forming an amorphous silicon film and an $n^+$ amorphous silicon film in a successive manner; forming a metal film for forming an image signal line, a drain electrode, and a source electrode; forming a film made of silicon nitride which serves as a protective insulating film, and opening a through hole in the protective insulating film and in the gate insulating film; and forming a transparent conductive film to complete a pixel electrode, in which the laminated film of the first layer and the second layer is subjected to etching with an etchant having a pH within a range of 7.0 to 14.0.

According to the present invention, in a laminated film formed of a film made of an alloy containing copper as a main component and a film made of pure copper, the etching rate of the film made of an alloy containing copper as a main component is higher than the etching rate of the film made of pure copper which is formed in the lower layer.

Accordingly, when the film made of an alloy containing copper is disposed on the upper layer of the film made of pure copper which has a larger film thickness, the pattern cross-section becomes a tapered shape during a wet etching process. As a result, coverage of the insulating film laminated thereon is improved, leading to a reduction in failure such as interlayer short-circuit.

DETAILED DESCRIPTION OF THE INVENTION

Figure 1:
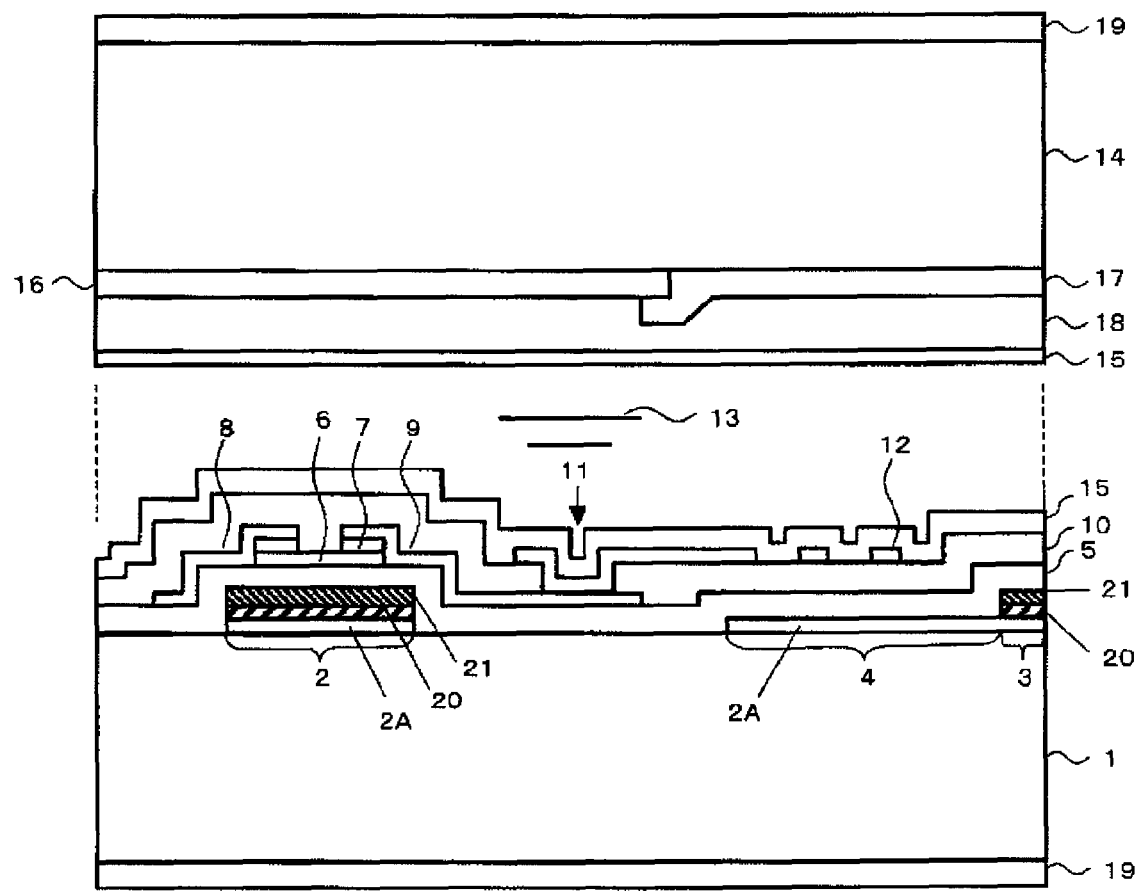
FIG. 1 is a sectional view illustrating a liquid crystal display device according to an embodiment of the present invention.

Hereinafter, embodiments of the present invention are described in detail.

Pure copper in the present invention refers to copper having a purity of 99.5% or more. Therefore, it is possible to form copper wiring having low resistance even when there are contained 0.5% of impurities necessary for producing a target which is normally used in sputtering film formation.

In order to secure low resistance and a tapered shape, a wiring structure of the present invention is a laminated structure formed of a laminated film including a first layer serving as a lower layer and a second layer serving as an upper layer formed on the first layer, in which a thick film made of pure copper is disposed as the first layer and an alloy film containing copper as a main component is thinly disposed thereon as the second layer.

When a thick film made of pure copper is disposed in the wiring structure, it is possible to take advantage of natural low resistance of copper. Further, in a wet etching process, an alloy film containing, as a main component, copper which has an etching rate higher than that of pure copper of the first layer is disposed as the second layer serving as the upper layer. Accordingly, in the case of performing wet etching on the first layer and the second layer collectively, a tapered shape can be secured because the etching rate of the second layer is higher than that of the first layer.

In order to increase the etching rate of an alloy containing copper as a main component in the upper layer, it is required to add an element which has solubility higher than solubility of a copper oxide in the wet etching process, as an additive metal element to be added to copper.

The additive metal element can be classified in terms of pH of an etchant. As metal elements capable of obtaining more effects with an etchant having pH smaller than 7.0, there are cerium, europium, hafnium, lutetium, manganese, magnesium, lead, terbium, thulium, zinc, and the like.

As metal elements capable of obtaining more effects with an etchant having pH of 7.0 or more, there are aluminum, boron, beryllium, bismuth, gallium, germanium, silicon, vanadium, and the like in addition to the above-mentioned metal elements.

In the case where the base is formed of an indium oxide (that is, transparent conductive film), it is necessary to limit the pH of the etchant to 1.8 or more so as not to dissolve the transparent conductive film of the base when the first layer and the second layer are processed.

Meanwhile, owing to the metal element to be added, the copper alloy added with a metal element of the second layer has a characteristic that corrosion resistance thereof is superior to that of pure copper of the first layer. When a metal element, which undergoes oxidation more easily than copper, has low equilibrium oxygen potential of an oxide (absolute value is large), and has a slow rate of oxidation (that is, growth law of an oxide film is secondary or tertiary), is added, there can be obtained an effect of enabling self-forming a protective oxide film on a surface to prevent oxidation of pure copper of the first layer. As metal elements having the above-mentioned characteristic, there are aluminum, beryllium, manganese, silicon, vanadium, zinc, and the like.

A film thickness of the second layer made of an alloy containing copper as a main component is desirably within a range of 10 nm to a value no larger than 10% of a film thickness of the first layer. When the film thickness of the second layer is larger, it may be difficult to provide taper, or the alloy film itself containing copper as a main component, which is disposed in the upper layer, may deteriorate coverage of an interlayer insulating film. Therefore, the film thickness is made to fall within the range of 10 nm to a value no larger than 10% of the film thickness of the first layer. Note that the alloy film containing copper as a main component is disposed for securing a taper shape in the wet etching process, and an effect thereof can be sufficiently obtained even when the film thickness is small.

In the present invention, the tapered shape preferably has a taper angle of 20° to 70° on a side end surface of copper wiring. Most preferably, the taper angle is 30° to 60°. If the taper angle is larger than 70°, coating performance of the insulating film is deteriorated, and thus voltage-resistant characteristics are lowered. Further, it is preferable to provide, as an initial layer, a layer made of copper which has a porous structure formed of fine crystal grains and voids between the first layer and a glass substrate, a transparent conductive film made of ITO or the like, or $n^+$-type amorphous silicon.

When a film with the above-mentioned structure is provided, adhesion is secured more easily.

Hereinafter, a first embodiment to a fifth embodiment according to the present invention is described with reference to the drawings. The drawings which have a capital A following a view number each schematically illustrate a part of a cross-section of an active matrix substrate at a stage when a thin film has been processed after each photolithography step and a photoresist has been stripped. The drawings which have a capital B following a view number each illustrate a photolithography step for the corresponding drawing which has the capital A following the view number. Here, the photolithography step of each of the embodiments refers to a series of steps for resist pattern formation, ranging from application of a photo resist through selective exposure using a mask to development of the mask, and repetitive description thereof is omitted.

[First Embodiment]

Hereinafter, the first embodiment for carrying out the present invention is described in detail with reference to FIG. 1 to FIGS. 6A and 6B.

FIG. 1 illustrates a cross-section of a liquid crystal display device according to the first embodiment of the present invention.

A method of manufacturing an active matrix substrate (on a transparent substrate 1 side) of the liquid crystal display device illustrated in FIG. 1 is described with reference to FIGS. 2A and 2B to FIGS. 6A and 6B.

Figure 2A:
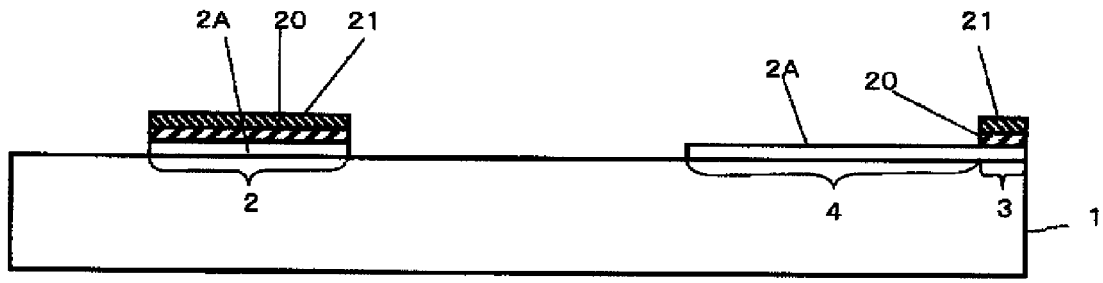
FIG. 2A is a diagram schematically illustrating a part of a cross-section of an active matrix substrate formed in a first photolithography step according to a first embodiment of the present invention.
Figure 2B:
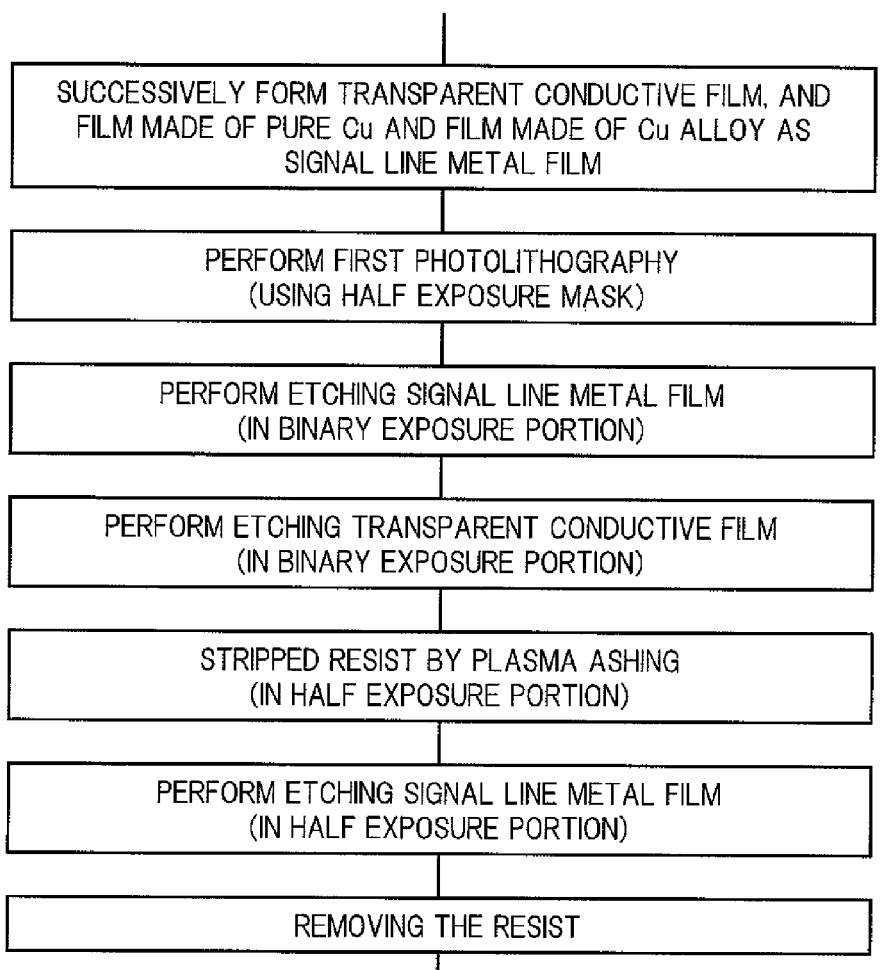
FIG. 2B is a flow chart illustrating the first photolithography step according to the first embodiment.

FIG. 2B illustrates a first photolithography step according to the first embodiment. In the first photolithography step according to the first embodiment, which is illustrated in FIG. 2B, first, a transparent conductive film made of an indium tin oxide is formed on a substrate 1 made of alkali free glass by sputtering.

Here, the transparent conductive film maybe made of an indium zinc oxide, an indium tin zinc oxide, a zinc aluminum oxide, or a zinc gallium oxide. A film thickness thereof is about 10 nm to 150 nm, and preferably, 30 to 50 nm.

Subsequently, a film made of pure copper (having a purity of 99.5% or more) and a film made of a copper alloy containing magnesium is successively formed by sputtering. In the first embodiment, a first layer 20 has a film thickness of 600 nm, and a second layer 21 has a film thickness of 50 nm. Note that an additive element of a copper alloy can be selected from, other than magnesium according to the first embodiment, boron, bismuth, cerium, europium, germanium, hafnium, lutetium, manganese, magnesium, lead, silicon, terbium, thulium, vanadium, and zinc.

Next, a resist pattern is formed by photolithography using a half exposure mask. Here, exposure is not performed to form a thicker resist in portions in which a scanning signal line 2 and a common signal line 3 are formed, while half exposure is performed to form a thinner resist in a portion in which a common (transparent) electrode 4 is formed.

After performing photolithography, the first layer 20 made of pure copper and the second layer 21 made of a copper alloy containing magnesium are etched, and then, the transparent conductive film is etched. Here, in the etching of the metal first layer 20 made of pure copper and the second layer 21 made of a copper alloy containing magnesium, an etchant having pH of 7.0 was used so as not to dissolve the transparent conductive film. Copper wiring having a taper shape can be obtained also in the case where an etchant having pH of 1.8 to 7.0 is used.

Here, the resist of the half exposure portion is stripped by plasma ashing. After the plasma ashing, the metal first layer 20 made of pure copper and the second layer 21 made of a copper alloy containing magnesium which are located in the half exposure portion are etched, thereby removing the resist. Then, when surfaces of the film made of a copper alloy containing magnesium and the film made of pure copper were observed after removing the resist, it was found that side end surfaces of the patterns have a tapered shape. Through the step described above, the scanning signal line 2 (including a gate electrode and a scanning signal line terminal), the common signal line 3 (including a common signal line terminal), and the common (transparent) electrode 4 are formed.

Figure 3A:
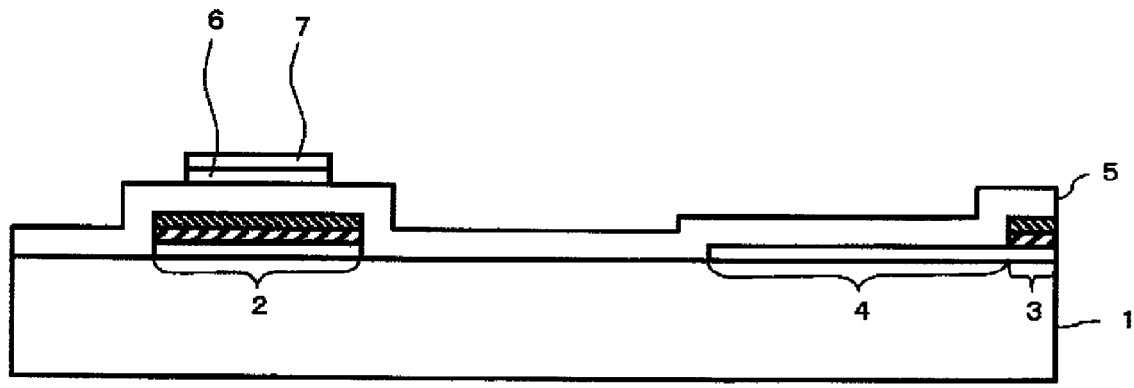
FIG. 3A is a diagram schematically illustrating a part of a cross-section of an active matrix substrate formed in a second photolithography step according to the first embodiment.
Figure 3B:
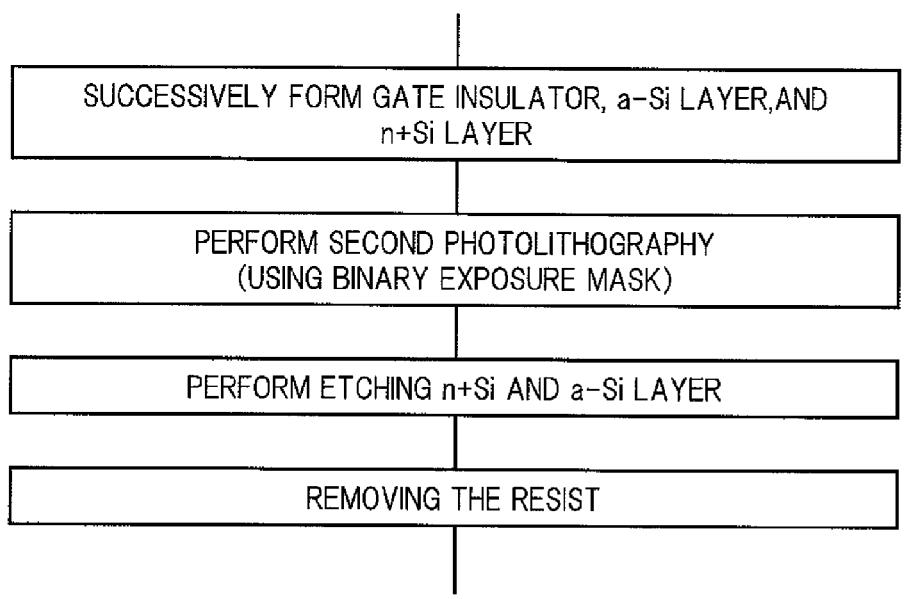
FIG. 3B is a flow chart illustrating the second photolithography step according to the first embodiment.

FIG. 3B illustrates a second photolithography step according to the first embodiment. In the second photolithography step according to the first embodiment, which is illustrated in FIG. 3B, first, a gate insulating film 5 made of silicon nitride, a semiconductor layer 6 made of amorphous silicon, and a contact layer 7 made of an $n^+$-type amorphous silicon are successively formed by a plasma enhanced chemical vapor deposition method.

Here, coverage of the gate insulating film, the layer made of amorphous silicon, and the layer made of $n^+$-type amorphous silicon was checked, and then it was found that copper-made scanning signal line which has a large film thickness and has a taper shape was covered without any aperture. Next, after the photolithography using a binary exposure mask, the contact layer 7 and the semiconductor layer 6 are selectively etched, and the resist is stripped, whereby a so-called island-shaped pattern is formed.

Figure 4A:
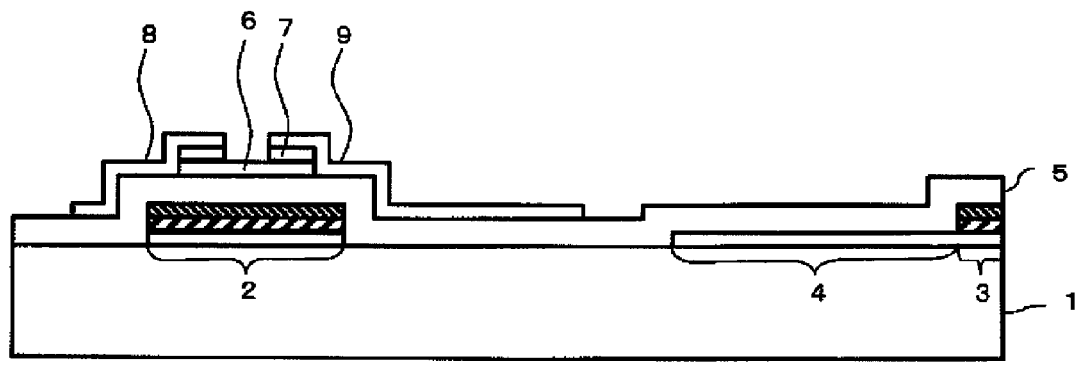
FIG. 4A is a diagram schematically illustrating a part of a cross-section of an active matrix substrate formed in a third photolithography step according to the first embodiment.
Figure 4B:
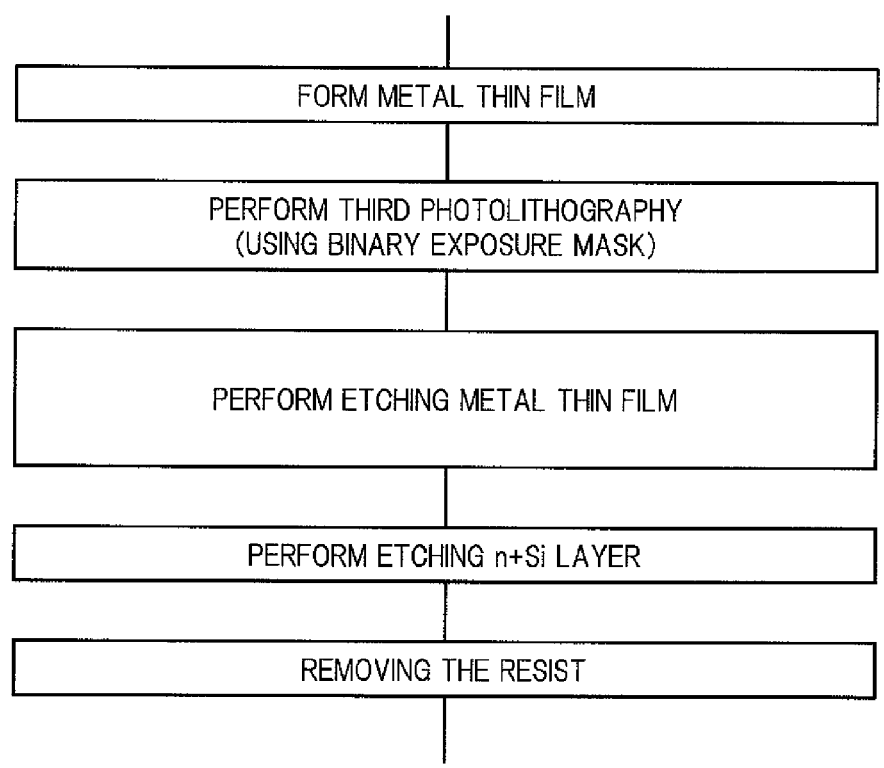
FIG. 4B is a flowchart illustrating the third photolithography step according to the first embodiment.

FIG. 4B illustrates a third photolithography step according to the first embodiment. In the third photolithography step according to the first embodiment, which is illustrated in FIG. 4B, first, a metal film is formed by sputtering. Next, after the photolithography using a binary exposure mask, the metal film is etched, and then the n⁺-type amorphous silicon layer is etched. Accordingly, a channel of the thin film transistor is separated, thereby removing the resist.

Through the step described above, an island-shaped pattern formed of a drain electrode 8 (including an image signal line and an image signal line terminal), a source electrode 9, and the contact layer 7 is formed.

Figure 5A:
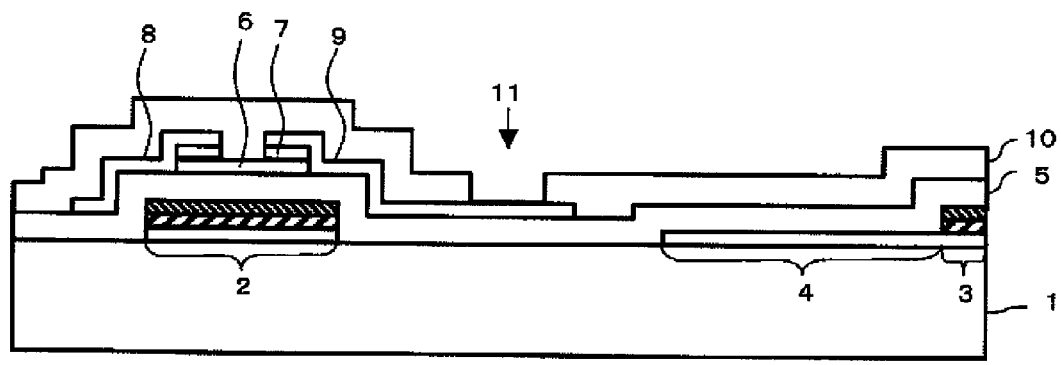
FIG. 5A is a diagram schematically illustrating a part of a cross-section of an active matrix substrate formed in a fourth photolithography step according to the first embodiment.
Figure 5B:
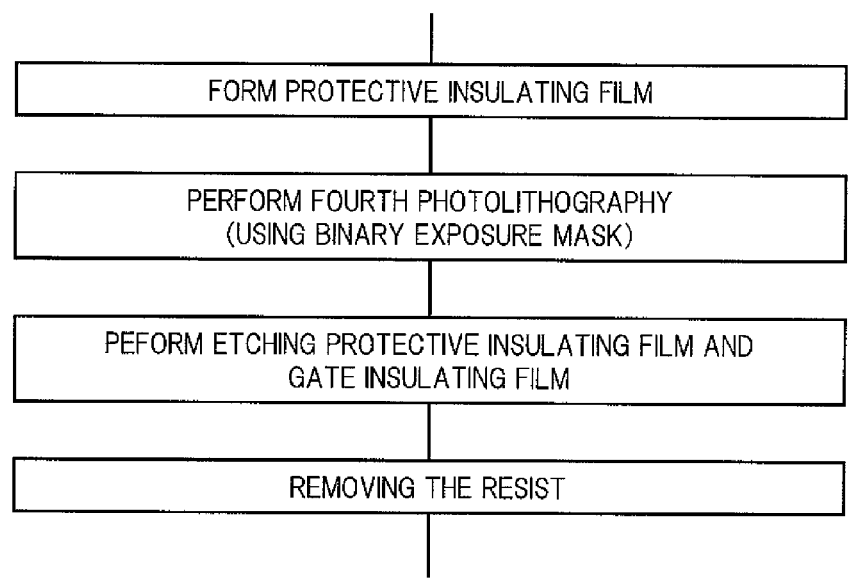
FIG. 5B is a flow chart illustrating the fourth photolithography step according to the first embodiment.

FIG. 5B illustrates a fourth photolithography step according to the first embodiment. In the fourth photolithography step according to the first embodiment, which is illustrated in FIG. 5B, first, a protective insulating film 10 made of silicon nitride is formed by a plasma enhanced chemical vapor deposition method. After the photolithography using a binary exposure mask, a through hole 11 is opened in the protective insulating film 10 located above the source electrode 9 and the image signal line terminal (not shown), and at the same time, another through hole 11 is opened in the protective insulating film 10 and the gate insulating film 5 which are located above the scanning signal line terminal (not shown), thereby removing the resist.

Figure 6A:
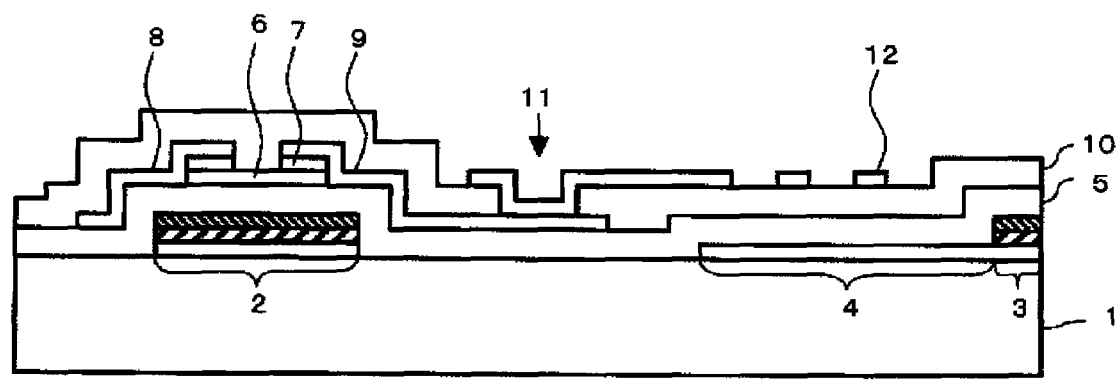
FIG. 6A is a diagram schematically illustrating a part of a cross-section of an active matrix substrate formed in a fifth photolithography step according to the first embodiment.
Figure 6B:
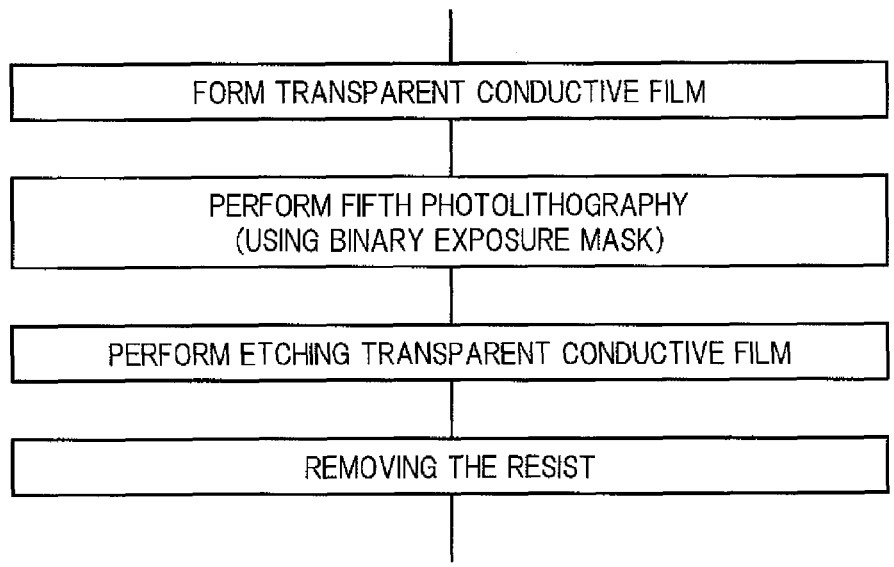
FIG. 6B is a flowchart illustrating the fifth photolithography step according to the first embodiment.

FIG. 6B illustrates a fifth photolithography step according to the first embodiment. In the fifth photolithography step according to the first embodiment, which is illustrated in FIG. 6B, first, a transparent conductive film made of an indium tin oxide is formed by sputtering.

First, after the photolithography using a binary exposure mask, patterns for a pixel electrode 12, the scanning signal line terminal (not shown), the common signal line terminal (not shown), and the image signal line terminal (not shown) are etched, thereby removing the resist. Through the step described above, an active matrix substrate of the liquid crystal display device is completed.

[Second Embodiment]

Hereinafter, the second embodiment for carrying out the present invention is described in detail with reference to FIGS. 7A and 7B to FIGS. 11A and 11B.

Figure 11A:
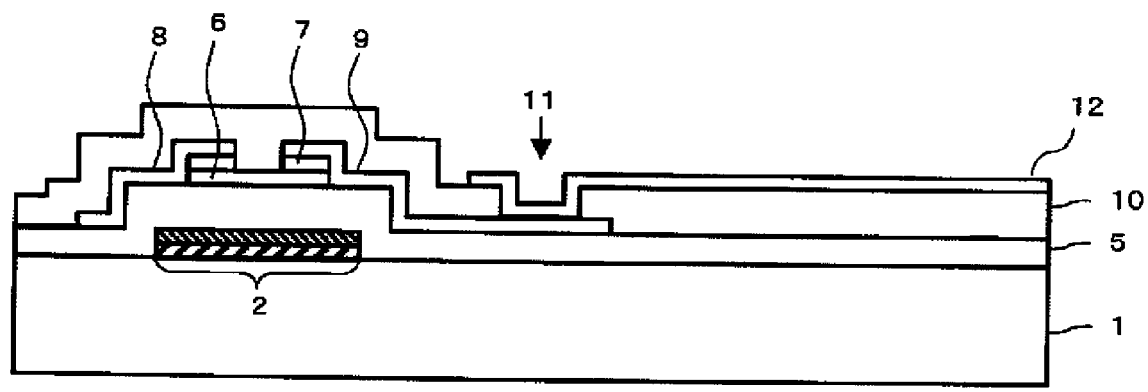
FIG. 11A is a diagram schematically illustrating a part of a cross-section of an active matrix substrate formed in a fifth photolithography step according to the second embodiment.

FIG. 11A illustrates a cross-section of an active matrix substrate of a liquid crystal display device in which liquid crystal is driven in a vertical electric field system according to the second embodiment of the present invention.

Figure 7A:
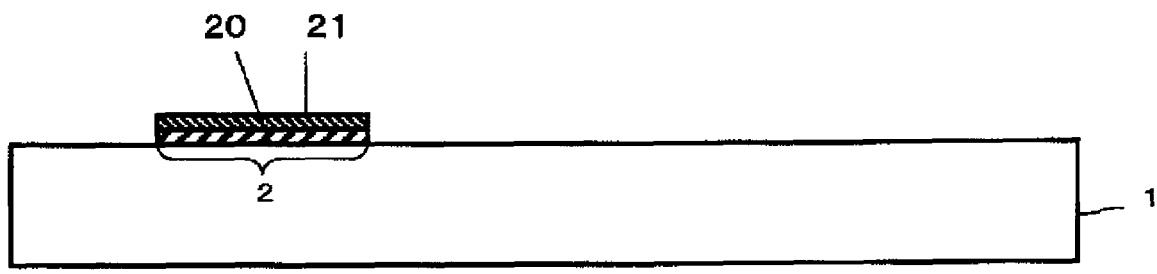
FIG. 7A is a diagram schematically illustrating a part of a cross-section of an active matrix substrate formed in a first photolithography step according to a second embodiment of the present invention.
Figure 7B:
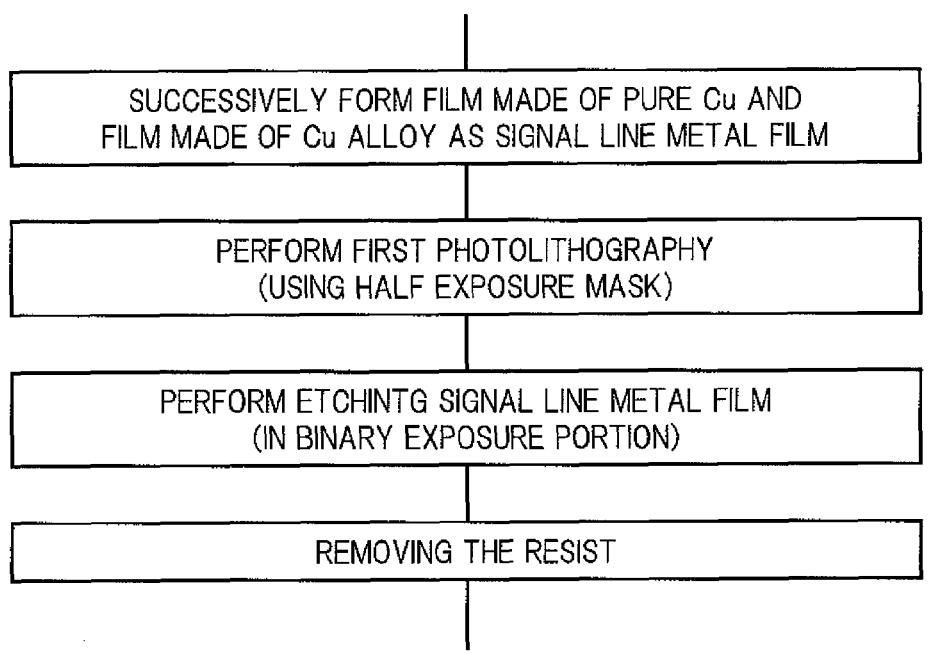
FIG. 7B is a flowchart illustrating the first photolithography step according to the second embodiment.

FIG. 7B illustrates a first photolithography step according to the second embodiment of the present invention. In the first photolithography step according to the second embodiment, which is illustrated in FIG. 7B, first, a first layer made of pure copper (having a purity of 99.5% or more) and a film made of a copper alloy containing manganese are sequentially formed on a substrate 1 made of alkali free glass by sputtering. Note that it is desirable to dispose, as an initial layer, a layer made of copper which has a porous structure formed of fine crystal grains and voids at an initial stage of forming the first layer 20.

In the second embodiment, the first layer 20 has a film thickness of 700 nm, and a second layer 21 has a film thickness of 70 nm. Note that an additive element of a copper alloy can be selected from, other than manganese according to the second embodiment, cerium, europium, hafnium, lutetium, magnesium, lead, terbium, thulium, and zinc.

Next, after the photolithography using a binary exposure mask, a film made of a copper alloy containing manganese and a film made of pure copper are etched. Unlike the case of the first embodiment, in this case, a taper shape can be obtained even with an etchant having pH smaller than 1.8. Then, the resist is stripped, whereby a scanning signal line 2 (including a gate electrode and a scanning signal line terminal) is formed.

Figure 8A:
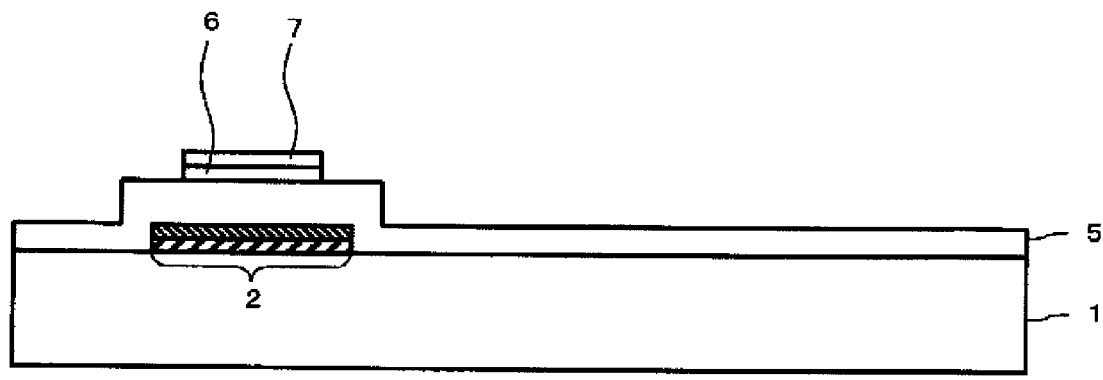
FIG. 8A is a diagram schematically illustrating a part of a cross-section of an active matrix substrate formed in a second photolithography step according to the second embodiment.
Figure 8B:
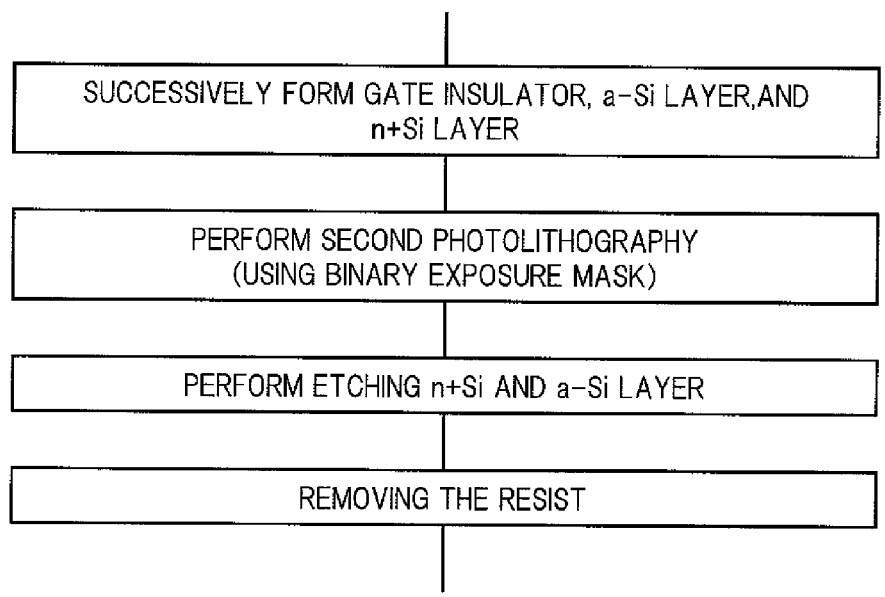
FIG. 8B is a flow chart illustrating the second photolithography step according to the second embodiment.

FIG. 8B illustrates a second photolithography step according to the second embodiment. In the second photolithography step according to the second embodiment, which is illustrated in FIG. 8B, first, a gate insulating film 5 made of silicon nitride, a semiconductor layer 6 made of amorphous silicon, and a contact layer 7 made of an n⁺-type amorphous silicon are successively formed by a plasma enhanced chemical vapor deposition method. Here, coverage of the gate insulating film, the layer made of amorphous silicon, and the layer made of n⁺-type amorphous silicon was checked, and then it was found that copper-made scanning signal line which has a large film thickness and has a taper shape was covered without containing an aperture.

Next, after the photolithography using a binary exposure mask, the contact layer 7 and the semiconductor layer 6 are selectively etched, and the resist is stripped, whereby a so-called island-shaped pattern is formed.

Figure 9A:
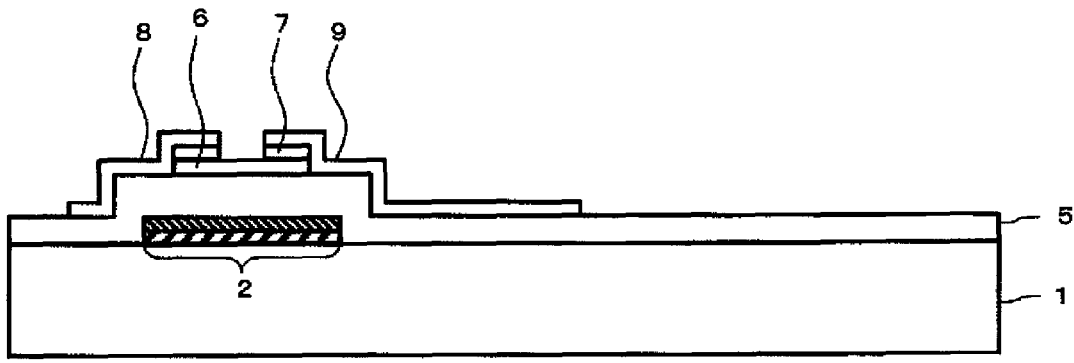
FIG. 9A is a diagram schematically illustrating a part of a cross-section of an active matrix substrate formed in a third photolithography step according to the second embodiment.
Figure 9B:
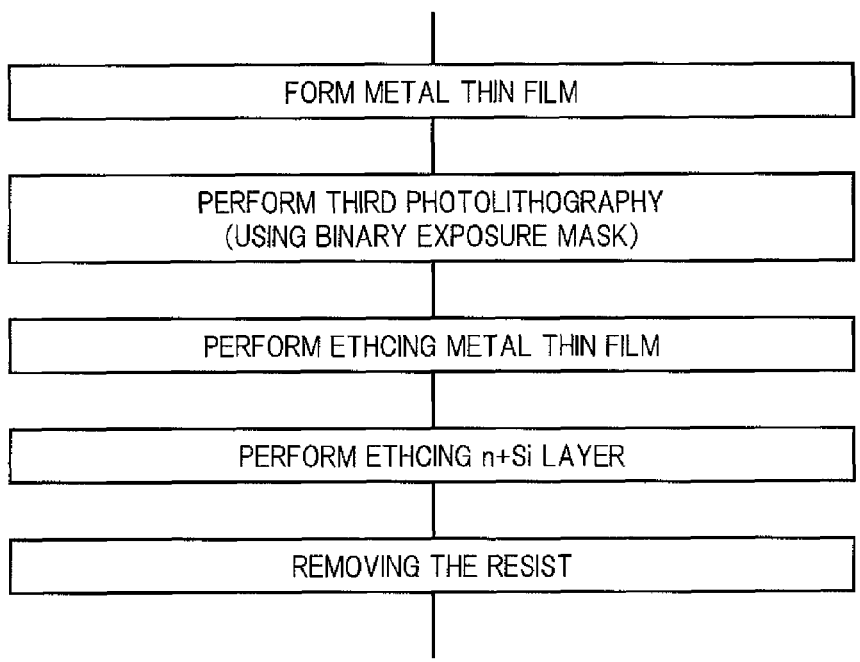
FIG. 9B is a flowchart illustrating the third photolithography step according to the second embodiment.

FIG. 9B illustrates a third photolithography step according to the second embodiment. In the third photolithography step according to the second embodiment, which is illustrated in FIG. 9B, first, a metal film made of molybdenum for the image signal line is formed. Molybdenum is used in the second embodiment, but a laminated film of a film made of pure copper and a film made of metal such as molybdenum having barrier performance may be used.

Next, after the photolithography using a binary exposure mask, the film made of molybdenum is etched, and then the n⁺-type amorphous silicon layer is etched. Accordingly, a channel of the thin film transistor is separated, thereby removing the resist. Through the step described above, an island-shaped pattern formed of a drain electrode 8 (including an image signal line and an image signal line terminal), a source electrode 9, and the contact layer 7 is formed.

Figure 10A:
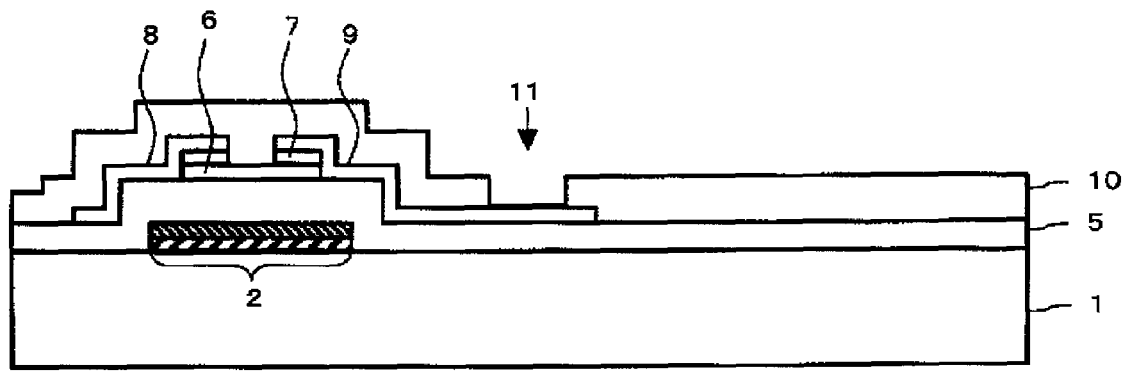
FIG. 10A is a diagram schematically illustrating a part of a cross-section of an active matrix substrate formed in a fourth photolithography step according to the second embodiment.
Figure 10B:
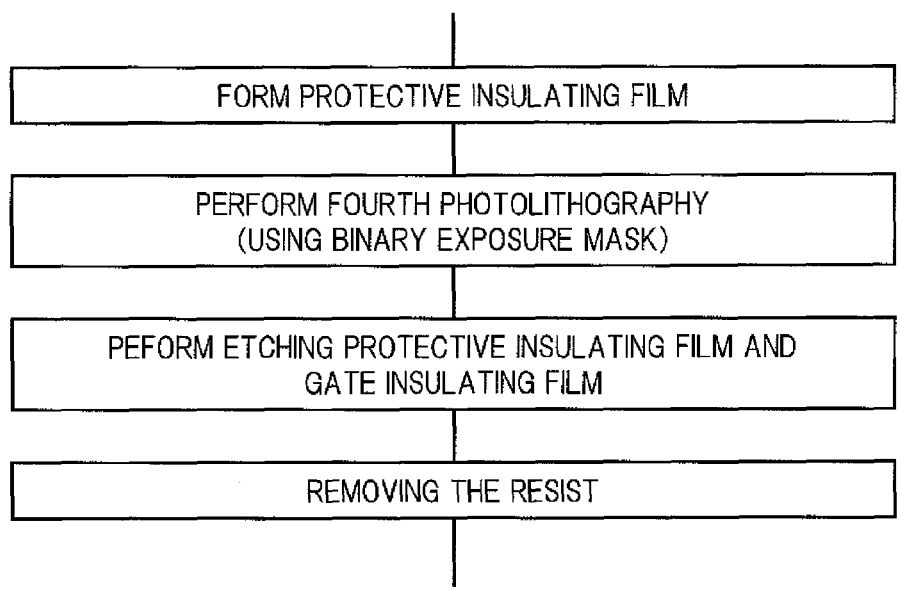
FIG. 10B is a flow chart illustrating the fourth photolithography step according to the second embodiment.

FIG. 10B illustrates a fourth photolithography step according to the second embodiment. In the fourth photolithography step according to the second embodiment, which is illustrated in FIG. 10B, first, a protective insulating film 10 made of silicon nitride is formed by a plasma enhanced chemical vapor deposition method. After the photolithography using a binary exposure mask, a through hole 11 is opened in the protective insulating film 10 located above the source electrode 9 and the image signal line terminal (not shown), and at the same time, another through hole 11 is opened in the protective insulating film 10 and the gate insulating film 5 which are located above the scanning signal line terminal (not shown), thereby removing the resist.

Figure 11B:
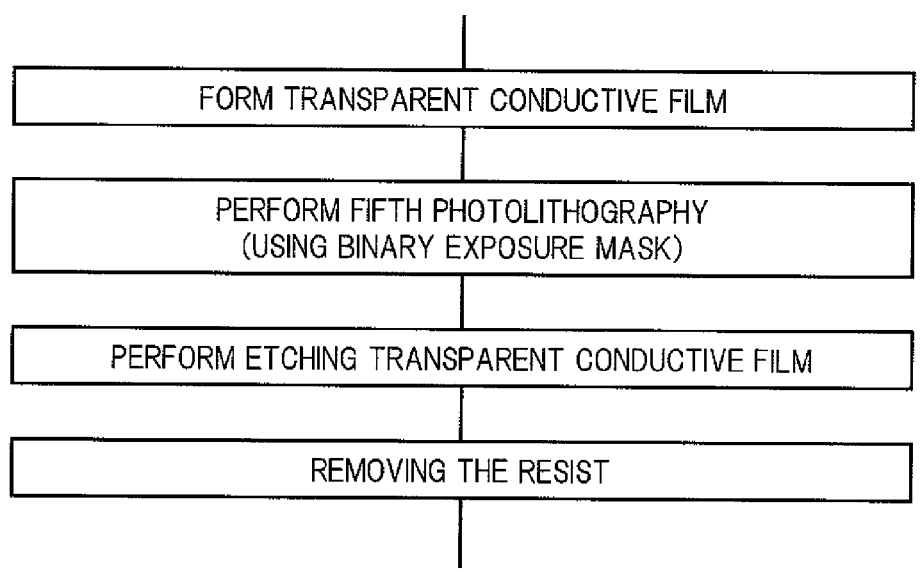
FIG. 11B is a flow chart illustrating the fifth photolithography step according to the second embodiment.

FIG. 11B illustrates a fifth photolithography step according to the second embodiment. In the fifth photolithography step according to the second embodiment, which is illustrated in FIG. 11B, a transparent conductive film made of an indium tin oxide is formed by sputtering. First, after the photolithography using a binary exposure mask, patterns for a pixel electrode 12, the scanning signal line terminal (not shown), the common signal line terminal (not shown), and the image signal line terminal (not shown) are etched, thereby removing the resist.

Through the step described above, the active matrix substrate of the liquid crystal display device is completed.

[Third Embodiment]

Hereinafter, the third embodiment for carrying out the present invention is described in detail with reference to FIGS. 12A and 12B to FIGS. 16A and 16B.

Figure 15A:
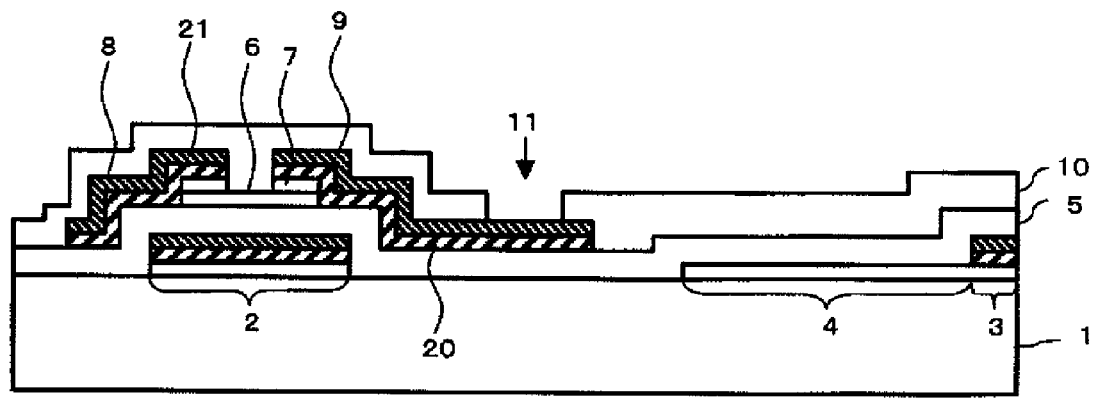
FIG. 15A is a diagram schematically illustrating a part of a cross-section of an active matrix substrate formed in a fourth photolithography step according to the third embodiment.
Figure 15B:
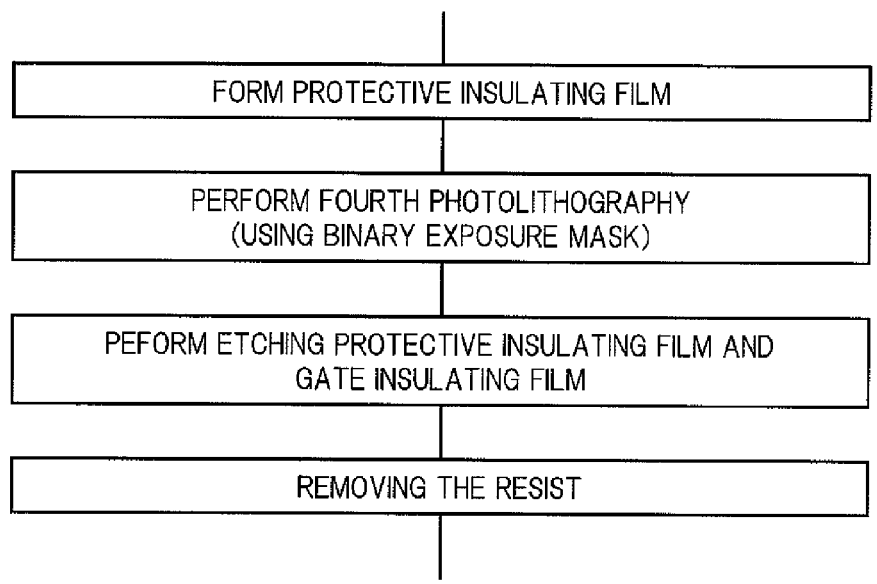
FIG. 15B is a flow chart illustrating the fourth photolithography step according to the third embodiment.
Figure 16A:
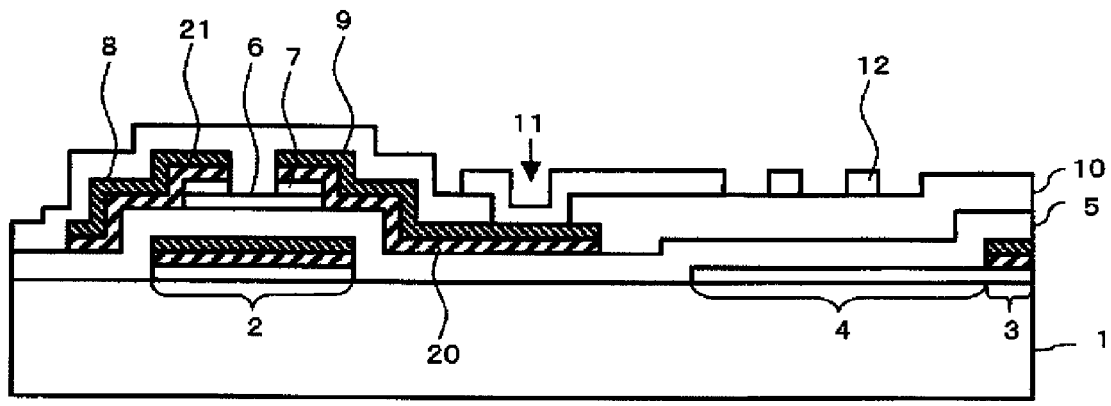
FIG. 16A is a diagram schematically illustrating a part of a cross-section of an active matrix substrate formed in a fifth photolithography step according to the third embodiment.

FIG. 16A illustrates a cross-section of an active matrix substrate of a liquid crystal display device according to the third embodiment of the present invention. A method of manufacturing the active matrix substrate (on a transparent substrate 1 side) of the liquid crystal display device, which is illustrated in FIG. 16A, is described with reference to FIGS. 12A and 12B to FIGS. 16A and 16B.

Figure 12A:
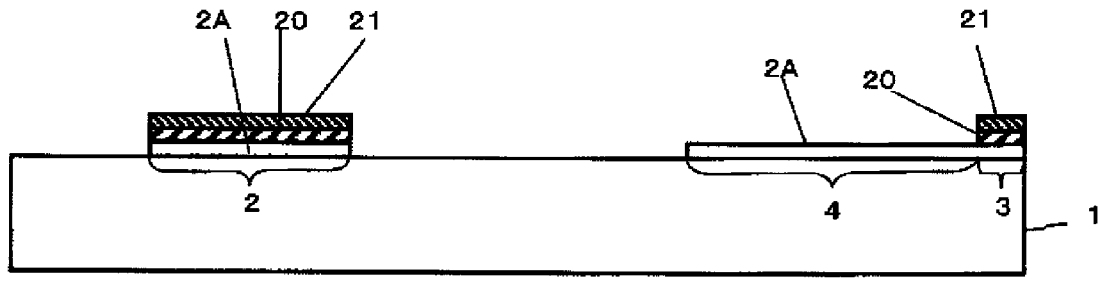
FIG. 12A is a diagram schematically illustrating a part of a cross-section of an active matrix substrate formed in a first photolithography step according to a third embodiment of the present invention.
Figure 12B:
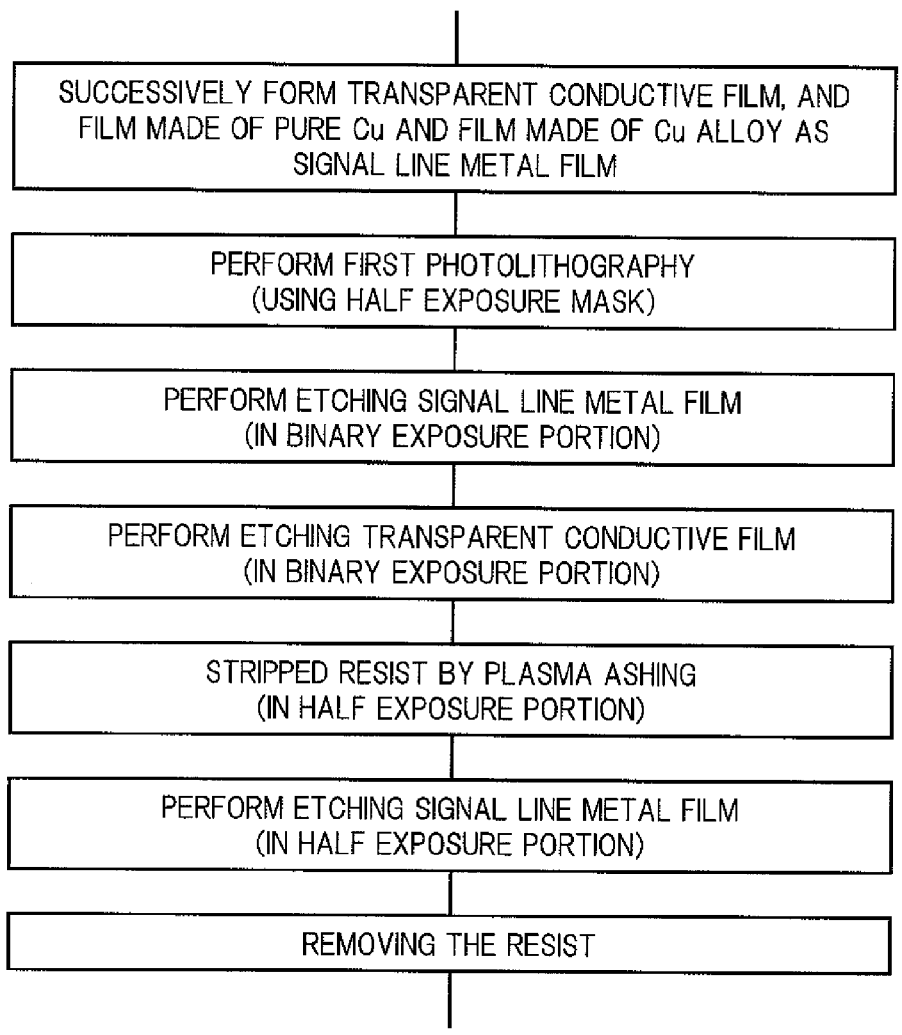
FIG. 12B is a flow chart illustrating the first photolithography step according to the third embodiment.

FIG. 12B illustrates a first photolithography step according to the third embodiment. In the first photolithography step according to the third embodiment, which is illustrated in FIG. 12B, first, a transparent conductive film made of an indium tin oxide is formed on a substrate 1 made of alkali free glass by sputtering. Here, the transparent conductive film may be made of an indium zinc oxide, an indium tin zinc oxide, a zinc aluminum oxide, or a zinc gallium oxide.

A film thickness of the transparent conductive film is about 10 nm to 150 nm, and preferably, 30 to 50 nm. Subsequently, a film made of pure copper (having a purity of 99.5% or more) and a film made of a copper alloy containing aluminum is successively formed by sputtering. The film thickness of the transparent conductive film according to the third embodiment is similar to that of the first embodiment.

Next, a resist pattern is formed by photolithography using a half exposure mask. Here, exposure is not performed to form a thicker resist in portions in which a scanning signal line 2 and a common signal line 3 are formed, while half exposure is performed to form a thinner resist in a portion in which a common (transparent) electrode 4 is formed. After the photolithography, a metal first layer 20 made of pure copper and a second layer 21 made of a copper alloy containing aluminum are etched, and then the transparent conductive film is etched.

Here, in the etching of the metal first layer 20 made of pure copper and the second layer 21 made of a copper alloy containing aluminum, an etchant having pH of 7.0 was used so as not to dissolve the transparent conductive film. Etching was performed using the etchant having pH of 7.0 in this embodiment, but an etchant having pH within a range of 7.0 to 14.0 (preferably, from 7.0 to 11.0) may be used.

Here, the resist of the half exposure portion is stripped by plasma ashing. After the plasma ashing, the metal first layer 20 made of pure copper and the second layer 21 made of a copper alloy containing aluminum, which are located in the half exposure portion, are etched, thereby removing the resist. When surfaces of the film made of a copper alloy containing aluminum and the film made of pure copper were observed after the resist has been stripped, it was found that side end surfaces of the patterns have a tapered shape. Through the step described above, the scanning signal line 2 (including a gate electrode and a scanning signal line terminal), the common signal 3 (including a common signal line terminal), and the common (transparent) electrode 4 are formed.

Figure 13A:
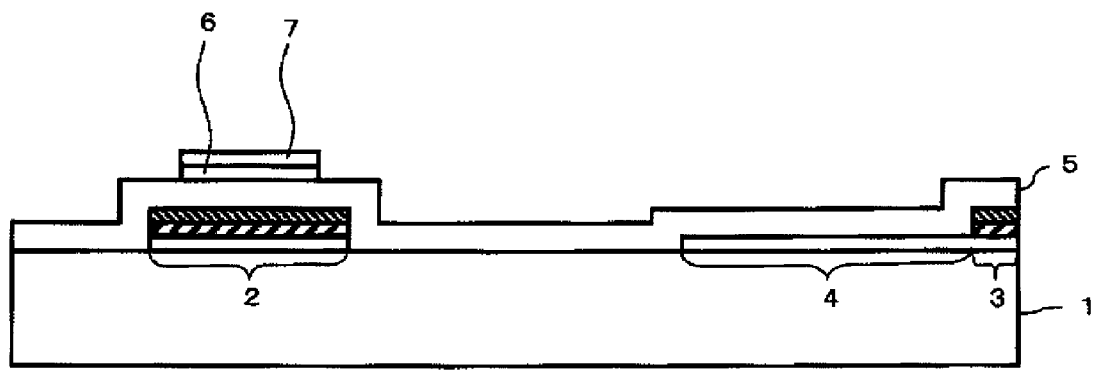
FIG. 13A is a diagram schematically illustrating a part of a cross-section of an active matrix substrate formed in a second photolithography step according to the third embodiment.
Figure 13B:
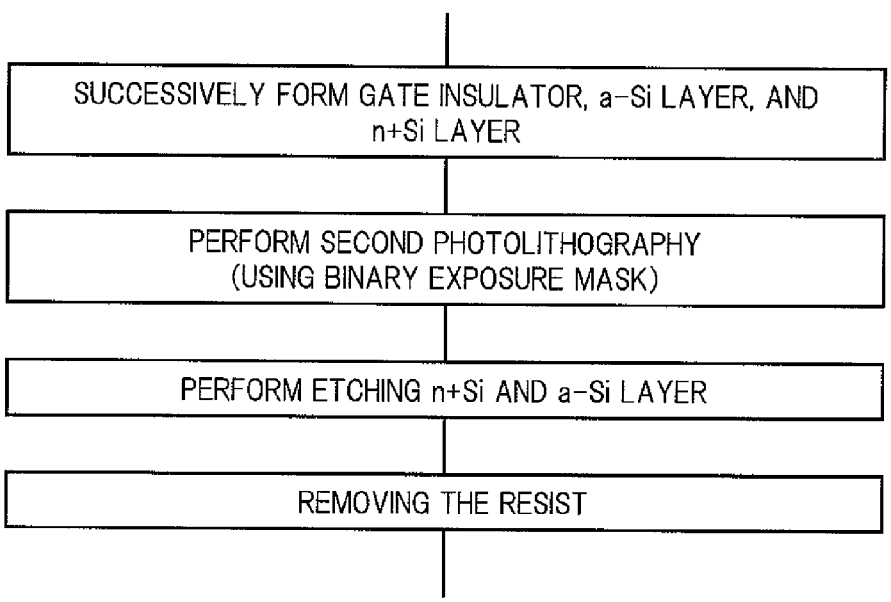
FIG. 13B is a flow chart illustrating the second photolithography step according to the third embodiment.

FIG. 13B illustrates a second photolithography step according to the third embodiment. In the second photolithography step according to the third embodiment, which is illustrated in FIG. 13B, first, a gate insulating film 5 made of silicon nitride, a semiconductor layer 6 made of amorphous silicon, and a contact layer 7 made of an $n^+$-type amorphous silicon are successively formed by a plasma enhanced chemical vapor deposition method. After the photolithography using a binary exposure mask, the contact layer 7 and the semiconductor layer 6 are selectively etched, and the resist is stripped, whereby a so-called island-shaped pattern is formed.

Figure 14A:
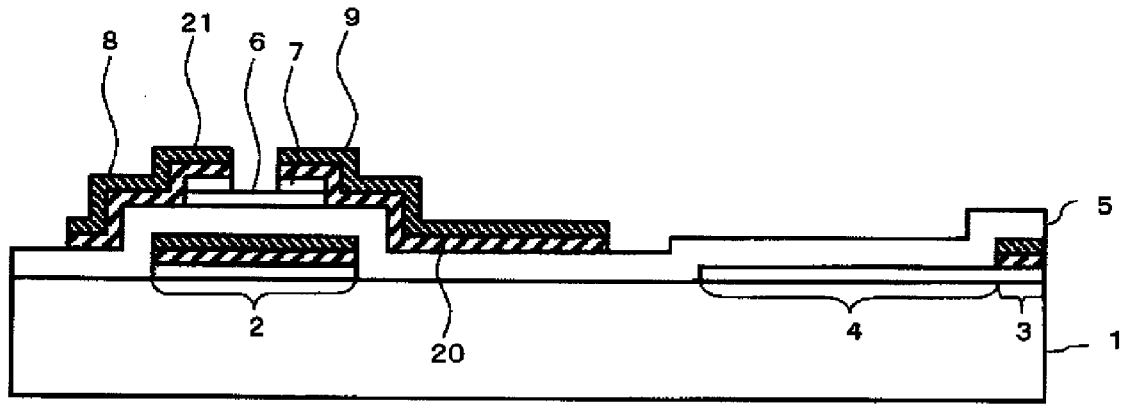
FIG. 14A is a diagram schematically illustrating a part of a cross-section of an active matrix substrate formed in a third photolithography step according to the third embodiment.
Figure 14B:
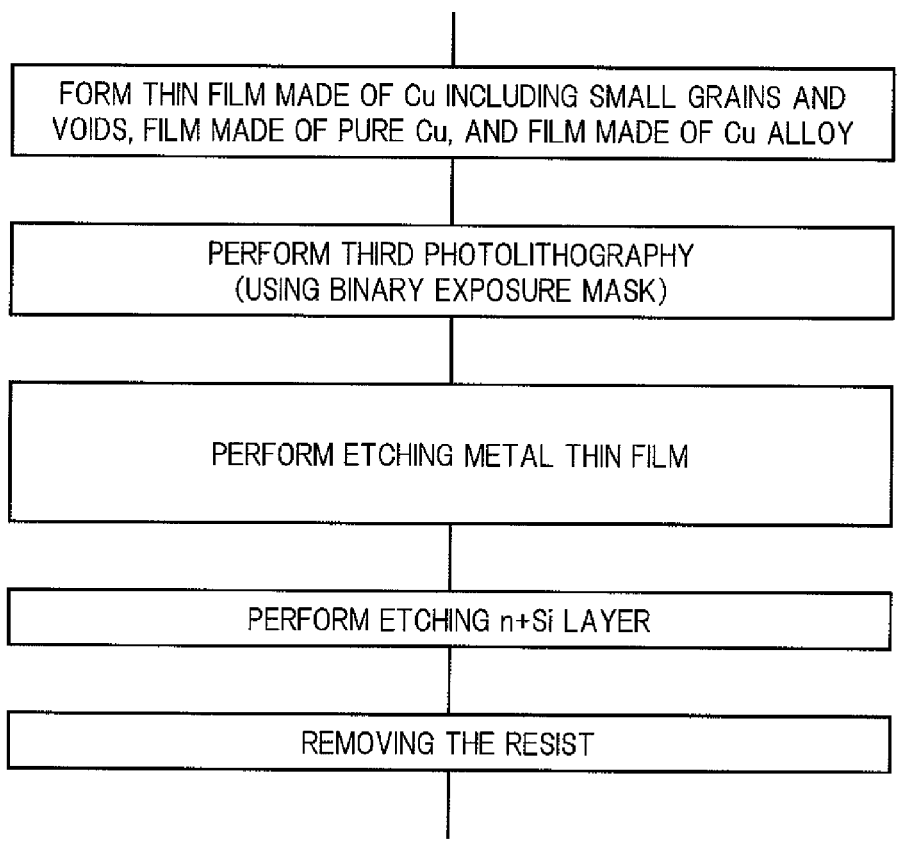
FIG. 14B is a flow chart illustrating the third photolithography step according to the third embodiment.

FIG. 14B illustrates a third photolithography step according to the third embodiment. In the third photolithography step according to the third embodiment, which is illustrated in FIG. 14B, first, a pure copper target is used to form a first layer 20. In this case, at an initial stage when the film is formed to have a film thickness of 50 nm, mixed gas of oxygen gas and argon gas is used to form a film made of copper including corpuscles and voids, and then, a film made of pure copper is successively formed using only argon gas.

Then, a second layer 21 made of a copper alloy containing aluminum is successively formed. Next, after the photolithography using a binary exposure mask, a laminated film including: the film made of a copper alloy containing aluminum; and the film made of pure copper and copper including corpuscles and voids is etched away using an etchant having pH of 7.0. Then, an $n^+$-type amorphous silicon layer is etched away, whereby a channel of a thin film transistor is separated, and the resist is stripped.

Through the step described above, an island-shaped pattern formed of a drain electrode 8 (including an image signal line and an image signal line terminal), a source electrode 9, and a contact layer 7 is formed. In this embodiment, the film made of copper including corpuscles and voids is formed between the copper-laminated film and the layer of the $n^+$-type amorphous silicon as an initial layer. However, effects such as adhesion can be obtained more easily even when a barrier film made of molybdenum or the like is disposed therebetween.

FIG. 15B illustrates a fourth photolithography step according to the third embodiment. In the fourth photolithography step according to the third embodiment, which is illustrated in FIG. 15B, first, a protective insulating film 10 made of silicon nitride is formed by a plasma enhanced chemical vapor deposition method. After the photolithography using a binary exposure mask, a through hole 11 is opened in the protective insulating film 10 located above the source electrode 9 and an image signal line terminal (not shown), and at the same time, another through hole 11 is opened in the protective insulating film 10 and the gate insulating film 5 which are located above the scanning signal line terminal (not shown), thereby removing the resist.

Figure 16B:
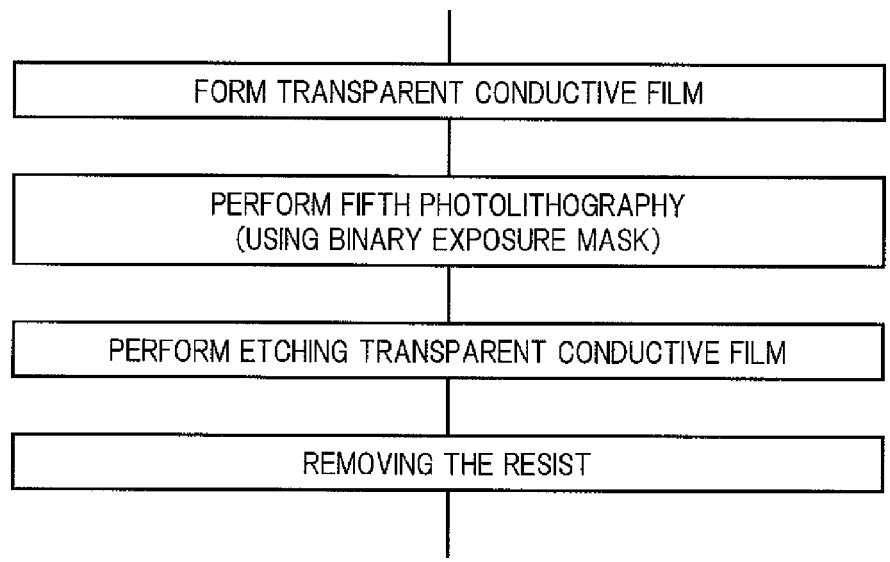
FIG. 16B is a flow chart illustrating the fifth photolithography step according to the third embodiment.

FIG. 16B illustrates a fifth photolithography step according to the third embodiment. In the fifth photolithography step according to the third embodiment, which is illustrated in FIG. 16B, the transparent conductive film made of an indium tin oxide is formed by sputtering. First, after the photolithography using the binary exposure mask, patterns for a pixel electrode 12, the scanning signal line terminal (not shown), the common signal line terminal (not shown), and the image signal line terminal (not shown) are etched, thereby removing the resist.

Through the step described above, the active matrix substrate of the liquid crystal display device is completed.

As described in the third embodiment above, the laminated film of the first layer 20 made of pure copper and the second layer 21 made of a copper alloy containing aluminum is also applicable to the scanning signal line, the source electrode, the drain electrode, and the image signal line.

[Fourth Embodiment]

Hereinafter, the fourth embodiment for carrying out the present invention is described in detail with reference to FIGS. 17A and 17B to FIGS. 21A and 21B.

Figure 21A:
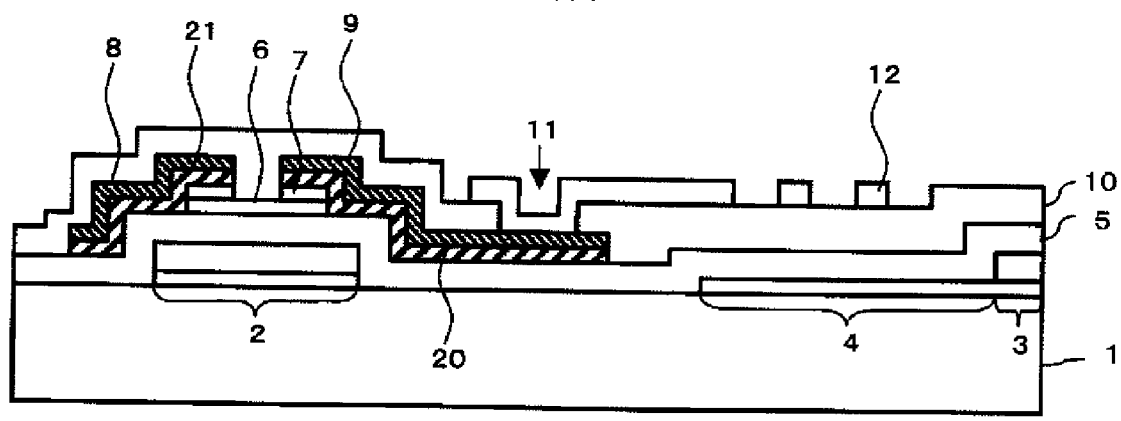
FIG. 21A is a diagram schematically illustrating a part of a cross-section of an active matrix substrate formed in a fifth photolithography step according to the fourth embodiment.

FIG. 21A illustrates a cross-section of an active matrix substrate of a liquid crystal display device according to the fourth embodiment of the present invention.

A method of manufacturing the active matrix substrate (on a transparent substrate 1 side) of the liquid crystal display device, which is illustrated in FIG. 21A, is described with reference to FIGS. 17A and 17B to FIGS. 21A and 21B.

Figure 17A:
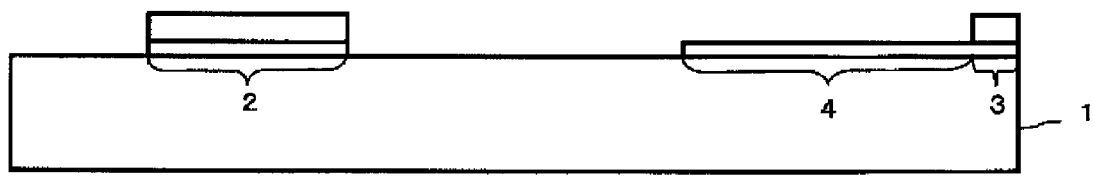
FIG. 17A is a diagram schematically illustrating a part of a cross-section of an active matrix substrate formed in a first photolithography step according to a fourth embodiment of the present invention.
Figure 17B:
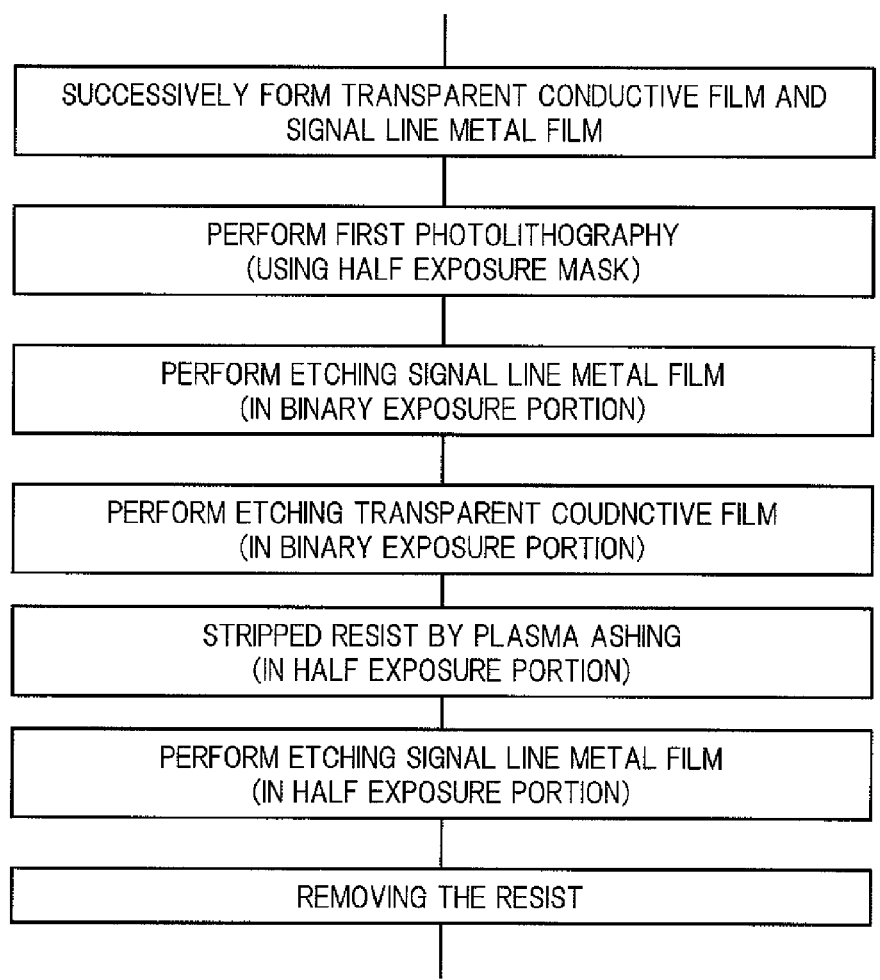
FIG. 17B is a flow chart illustrating the first photolithography step according to the fourth embodiment.

FIG. 17B illustrates a first photolithography step according to the fourth embodiment. In the first photolithography step according to the fourth embodiment, which is illustrated in FIG. 17B, first, a transparent conductive film made of an indium tin oxide is formed on a substrate 1 made of alkali free glass by sputtering. Here, the transparent conductive film may be made of an indium zinc oxide, an indium tin zinc oxide, a zinc aluminum oxide, or a zinc gallium oxide. A film thickness thereof is about 10 nm to 150 nm, and preferably, 30 to 50 nm. Subsequently, a signal line metal film is successively formed by sputtering. Molybdenum was used for the signal line metal film in this embodiment.

Next, a resist pattern is formed by photolithography using a half exposure mask. Here, exposure is not performed to form a thicker resist in portions in which a scanning signal line 2 and a common signal line 3 are formed, while half exposure is performed to form a thinner resist in a portion in which a common (transparent) electrode 4 is formed. After the photolithography, the signal line metal film is etched, and then the transparent conductive film is etched. Here, the resist of the half exposure portion is stripped by plasma ashing. After the plasma ashing, the metal film of the half exposure portion is etched, thereby removing the resist.

Through the step described above, the scanning signal line 2 (including a gate electrode and a scanning signal line terminal), the common signal line 3 (including a common signal line terminal), and a common (transparent) electrode 4 are formed.

Figure 18A:
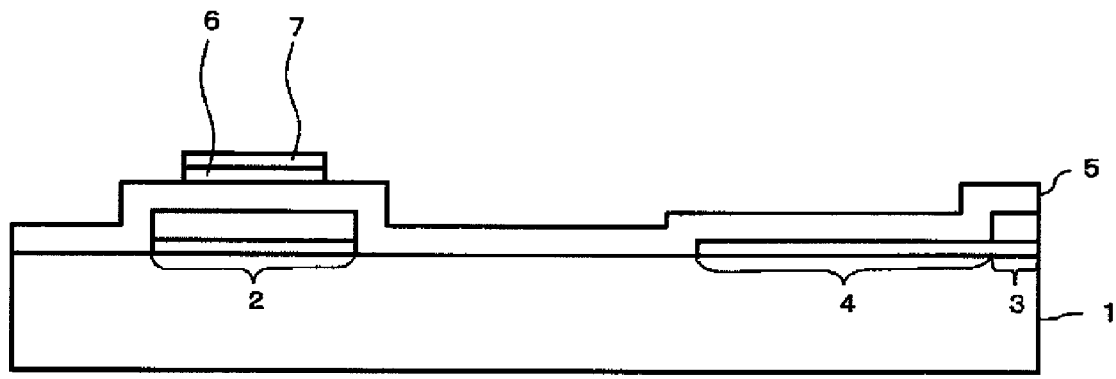
FIG. 18A is a diagram schematically illustrating a part of a cross-section of an active matrix substrate formed in a second photolithography step according to the fourth embodiment.
Figure 18B:
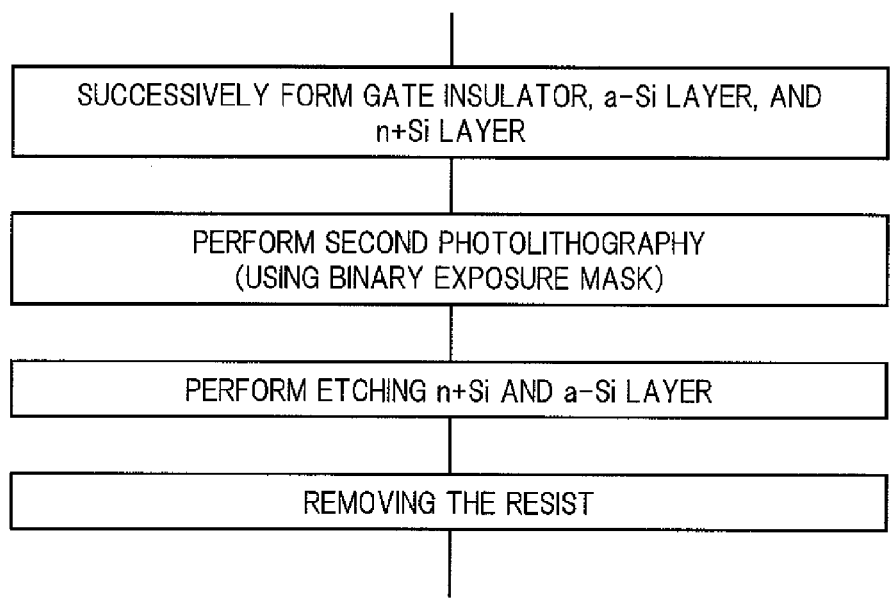
FIG. 18B is a flow chart illustrating the second photolithography step according to the fourth embodiment.

FIG. 18B illustrates a second photolithography step according to the fourth embodiment. In the second photolithography step according to the fourth embodiment, which is illustrated in FIG. 18B, a gate insulating film 5 made of silicon nitride, a semiconductor layer 6 made of amorphous silicon, and a contact layer 7 made of an $n^+$-type amorphous silicon are successively formed by a plasma enhanced chemical vapor deposition method. After the photolithography using a binary exposure mask, the contact layer 7 and the semiconductor layer 6 are selectively etched, and the resist is stripped, whereby a so-called island-shaped pattern is formed.

Figure 19A:
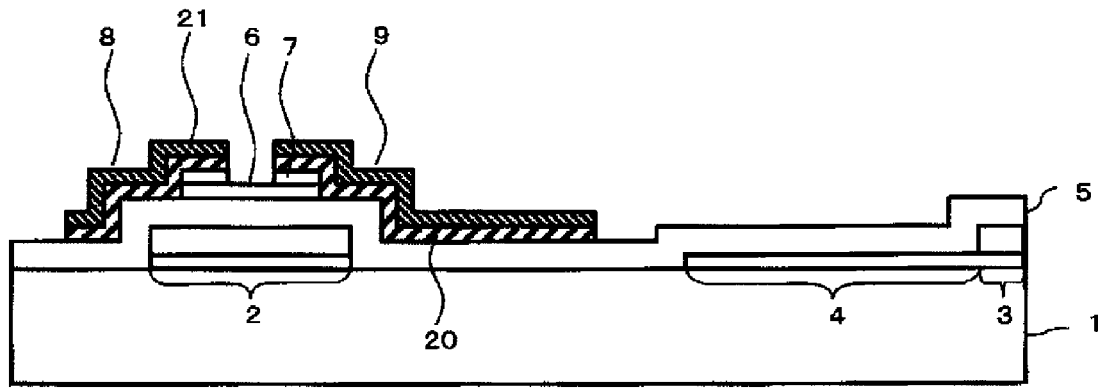
FIG. 19A is a diagram schematically illustrating a part of a cross-section of an active matrix substrate formed in a third photolithography step according to the fourth embodiment.
Figure 19B:
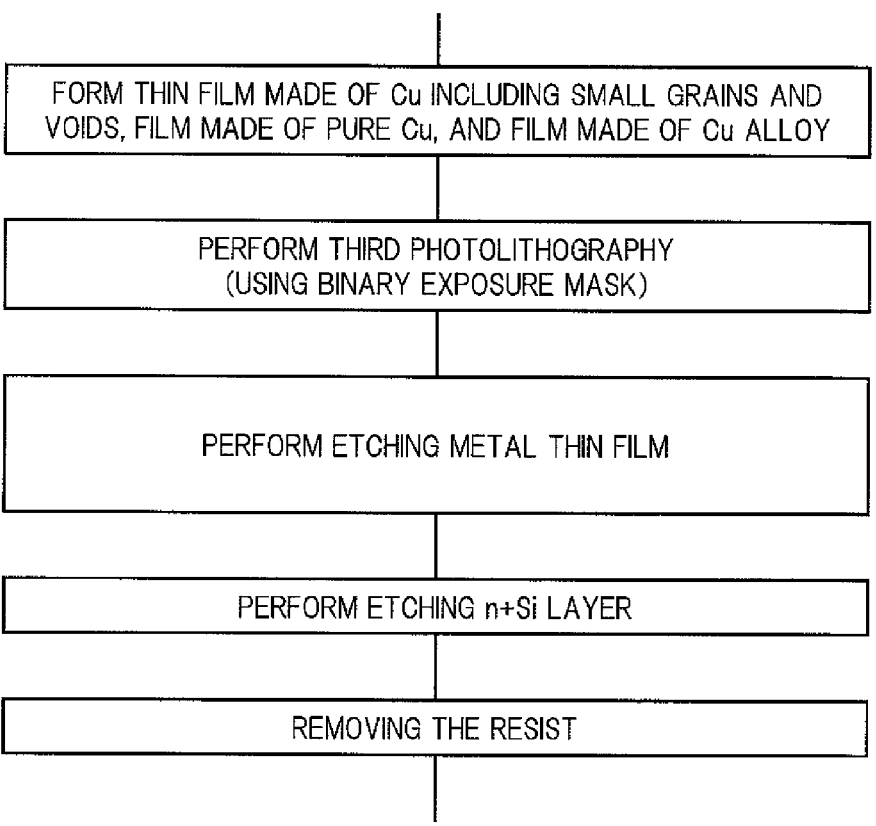
FIG. 19B is a flow chart illustrating the third photolithography step according to the fourth embodiment.

FIG. 19B illustrates a third photolithography step according to the fourth embodiment. In the third photolithography step according to the fourth embodiment, which is illustrated in FIG. 19B, first, a pure copper target is used to form a first layer 20. In this case, at an initial stage when the film is formed to have a film thickness of 50 nm, mixed gas of oxygen gas and argon gas is used to form a film made of copper including corpuscles and voids, and then, a film made of pure copper is successively formed using only argon gas.

Then, a second layer 21 made of a copper alloy containing aluminum is successively formed. Next, after the photolithography using a binary exposure mask, a laminated film including: the film made of a copper alloy containing aluminum; and the film made of pure copper and copper including corpuscles and voids is etched away using an etchant having pH of 8.0. Then, an $n^+$-type amorphous silicon layer is etched away, whereby a channel of a thin film transistor is separated, and the resist is stripped.

Through the step described above, an island-shaped pattern formed of a drain electrode 8 (including an image signal line and an image signal line terminal), a source electrode 9, and a contact layer 7 is formed.

Figure 20A:
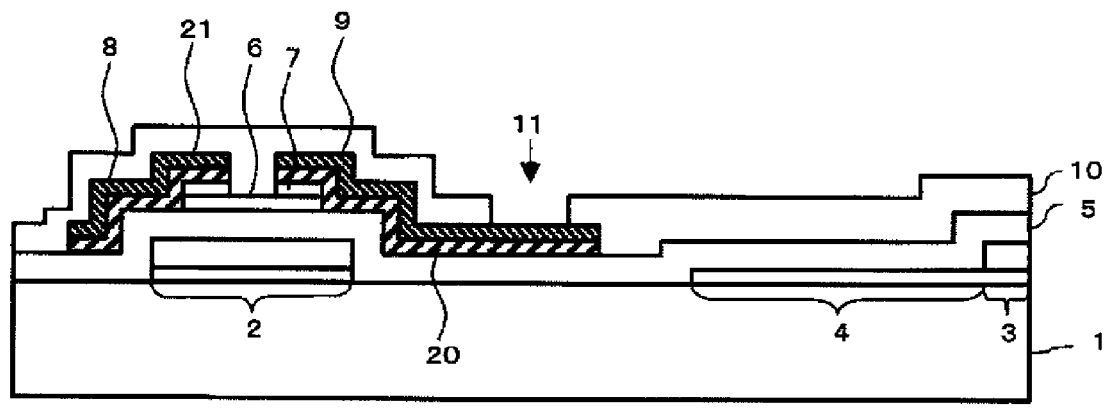
FIG. 20A is a diagram schematically illustrating a part of a cross-section of an active matrix substrate formed in a fourth photolithography step according to the fourth embodiment.
Figure 20B:
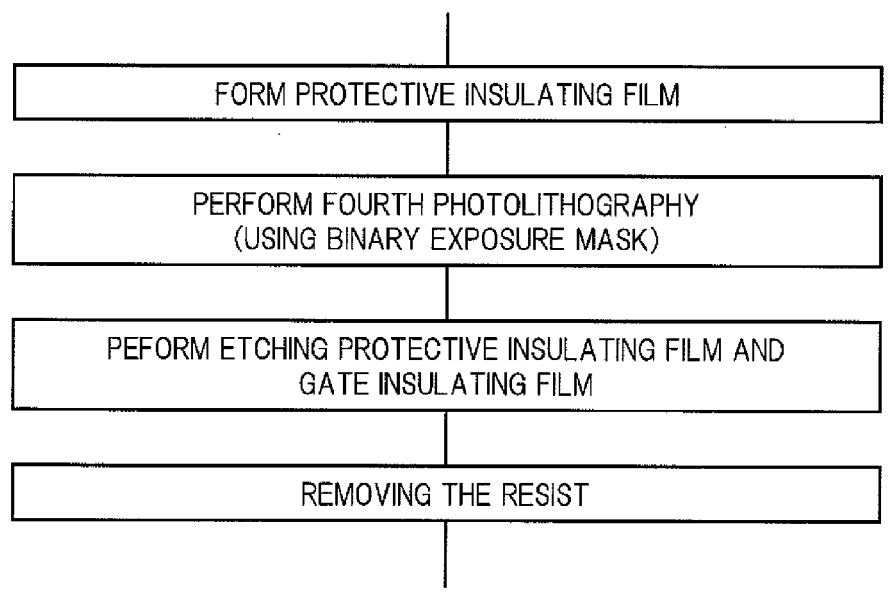
FIG. 20B is a flow chart illustrating the fourth photolithography step according to the fourth embodiment.

FIG. 20B illustrates a fourth photolithography step according to the fourth embodiment. In the fourth photolithography step according to the fourth embodiment, which is illustrated in FIG. 20B, first, a protective insulating film 10 made of silicon nitride is formed by a plasma enhanced chemical vapor deposition method. After the photolithography using a binary exposure mask, a through hole 11 is opened in the protective insulating film 10 located above the source electrode 9 and the image signal line terminal (not shown), and at the same time, another through hole 11 is opened in the protective insulating film 10 and the gate insulating film 5 which are located above the scanning signal line terminal (not shown), thereby removing the resist.

In this embodiment, the etchant having pH of 8.0 was used for etching of the laminated film including: the film made of a copper alloy containing aluminum; and the film made of pure copper and copper including corpuscles and voids. However, copper wiring having a taper shape can be formed similarly even with an etchant having pH within a range of 7.0 to 14.0 (desirably, pH within a range of 7.0 to 11.0).

Figure 21B:
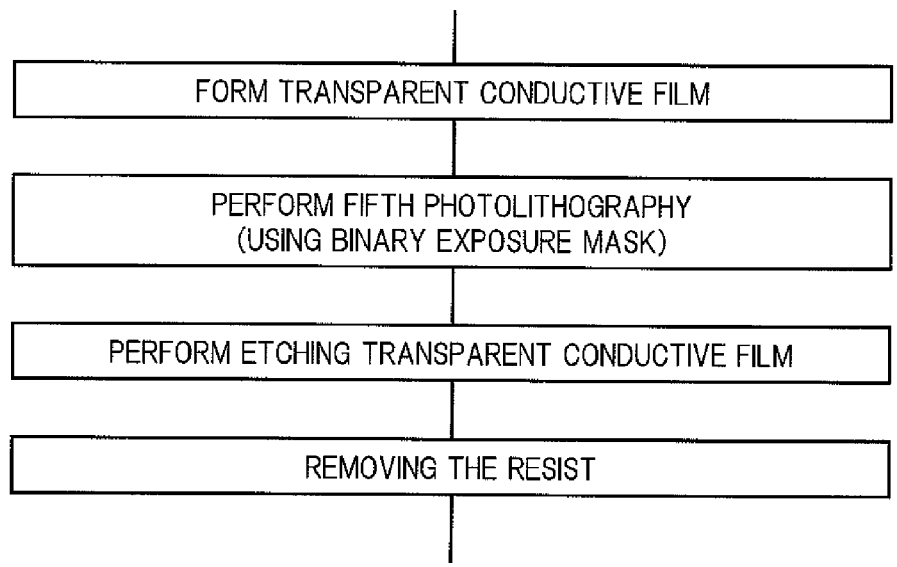
FIG. 21B is a flow chart illustrating the fifth photolithography step according to the fourth embodiment.

FIG. 21B illustrates a fifth photolithography step according to the fourth embodiment. In the fifth photolithography step according to the fourth embodiment, which is illustrated in FIG. 21B, the transparent conductive film made of an indium tin oxide is formed by sputtering. First, after the photolithography using a binary exposure mask, patterns for a pixel electrode 12, the scanning signal line terminal (not shown), the common signal line terminal (not shown), and the image signal line terminal (not shown) are etched, thereby removing the resist.

Through the step described above, the active matrix substrate of the liquid crystal display device is completed.

[Fifth Embodiment]

Hereinafter, the fifth embodiment for carrying out the present invention is described in detail with reference to FIGS. 22A and 22B to FIGS. 26A and 26B. Five photolithography steps are performed in the fourth embodiment, but four photolithography steps illustrated in FIG. 22B, FIG. 23B, FIG. 25B, and FIG. 26B are performed in the fifth embodiment. FIG. 24B illustrates the step replacing that of FIG. 23B.

Figure 24A:
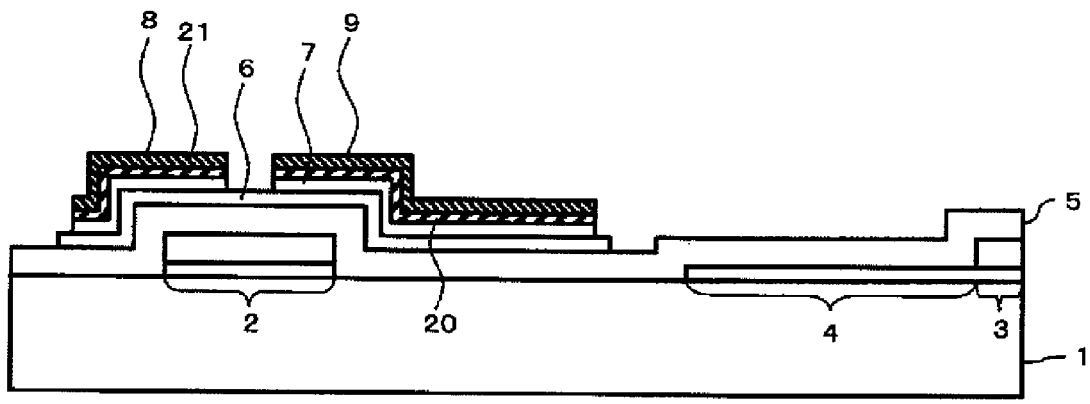
FIG. 24A is a diagram schematically illustrating a part of a cross-section of an active matrix substrate formed in another second photolithography step different from the second photolithography step of FIG. 23B.
Figure 24B:
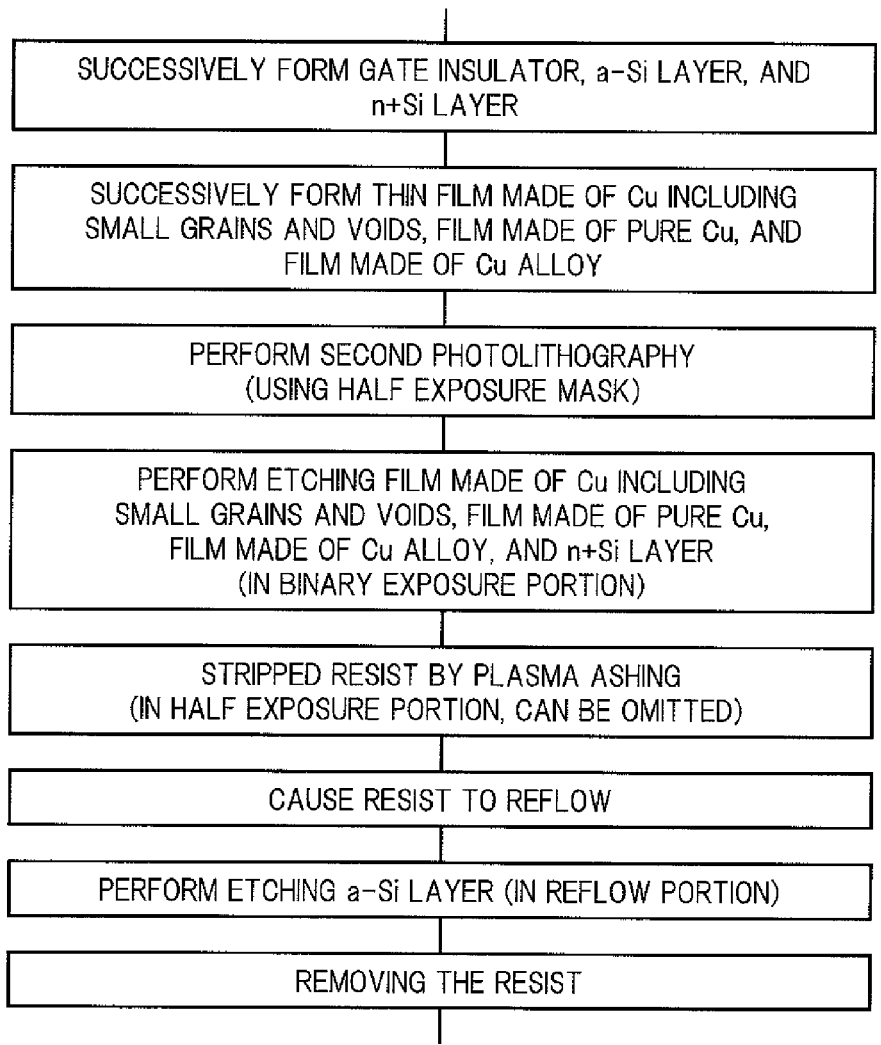
FIG. 24B is a flow chart illustrating the another second photolithography step different from the second photolithography step of FIG. 23B.
Figure 25A:
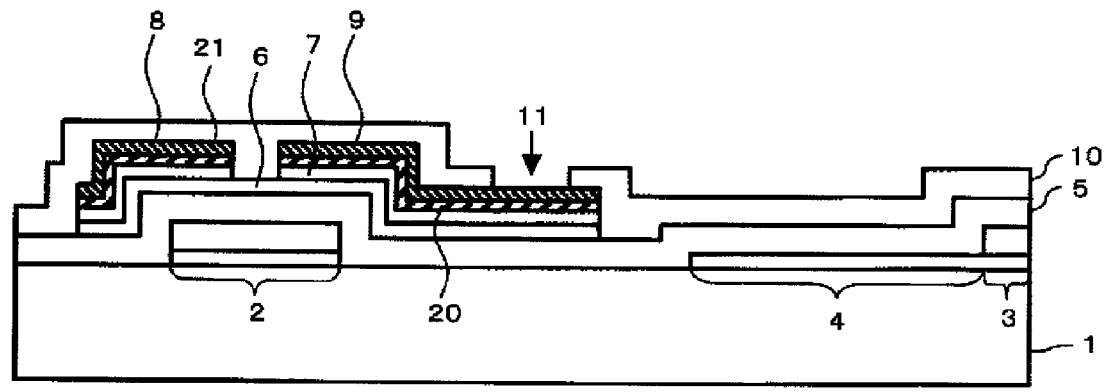
FIG. 25A is a diagram schematically illustrating a part of a cross-section of an active matrix substrate formed in a third photolithography step according to the fifth embodiment.
Figure 25B:
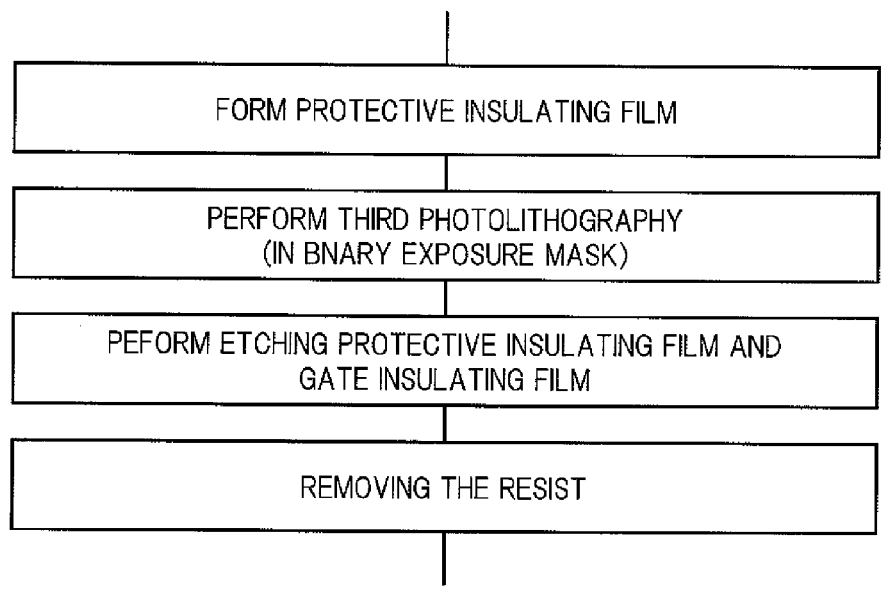
FIG. 25B is a flow chart illustrating the third photolithography step according to the fifth embodiment.
Figure 26A:
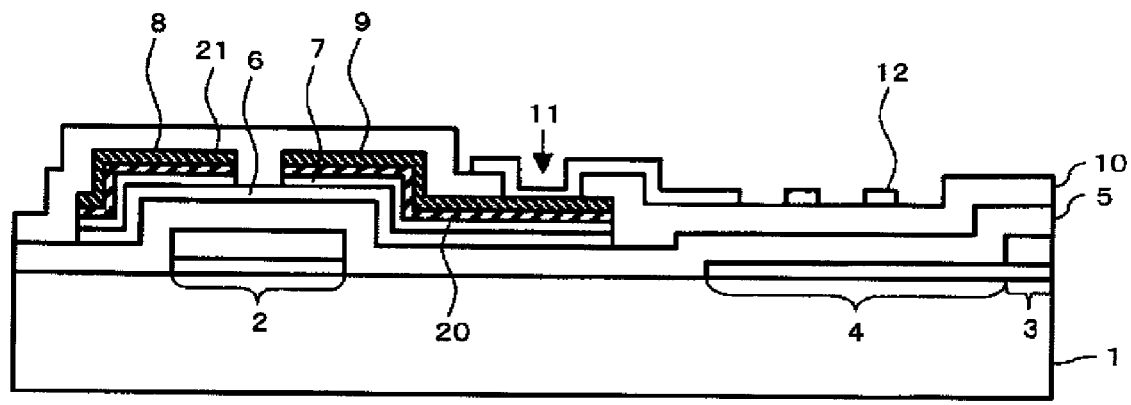
FIG. 26A is a diagram schematically illustrating a part of a cross-section of an active matrix substrate formed in a fourth photolithography step according to the fifth embodiment.

FIG. 26A illustrates a cross-section of an active matrix substrate of a liquid crystal display device according to the fifth embodiment of the present invention. A method of manufacturing the active matrix substrate (on a transparent substrate 1 side) of the liquid crystal display device, which is illustrated in FIG. 26A, is described with reference to FIGS. 22A and 22B to FIGS. 25A and 25B.

The active matrix substrate of the liquid crystal display device according to the fifth embodiment is different from the active matrix substrate of the liquid crystal display device illustrated in FIG. 21A in a structure of FIG. 26A in which a semiconductor layer 6 is formed on a gate insulating film 5, and a contact layer 7, a pure copper film 20, a copper alloy film 21, a source electrode 8, and a drain electrode 9 are laminated thereon.

Figure 22A:
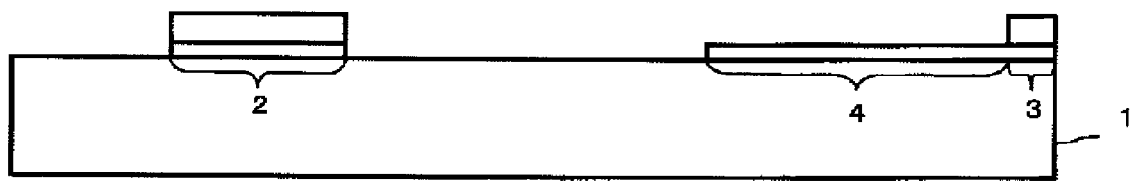
FIG. 22A is a diagram schematically illustrating a part of a cross-section of an active matrix substrate formed in a first photolithography step according to a fifth embodiment of the present invention.
Figure 22B:
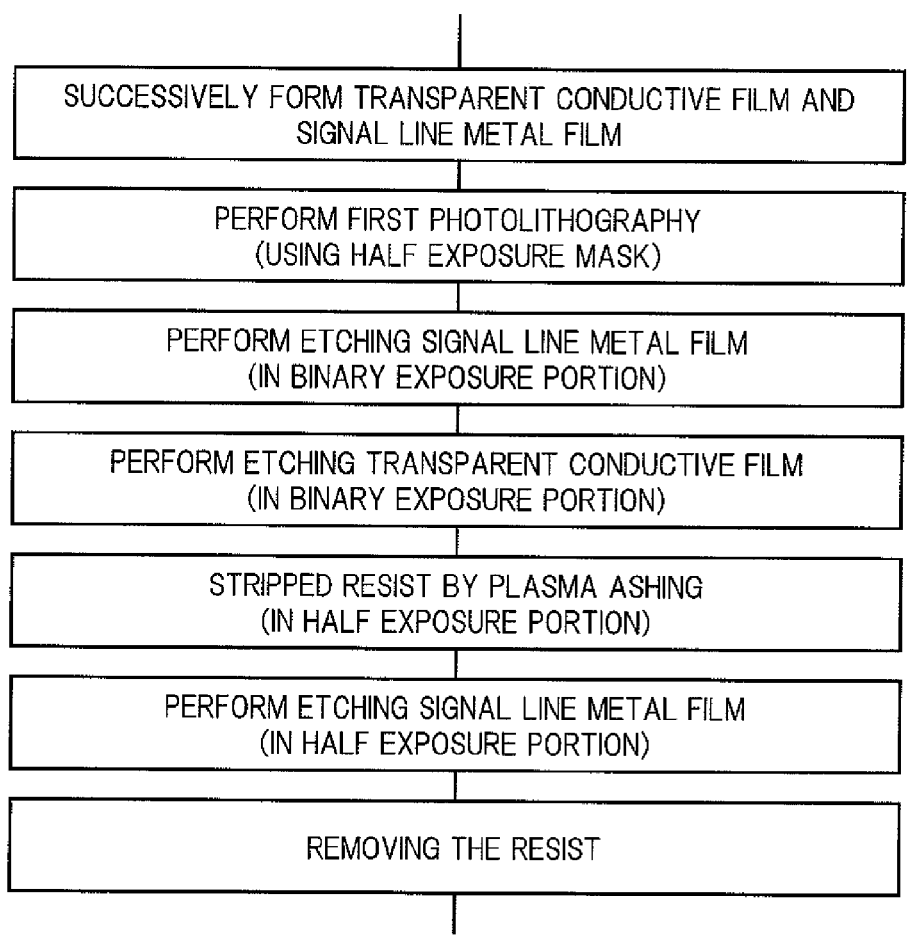
FIG. 22B is a flow chart illustrating the first photolithography step according to the fifth embodiment.

FIG. 22B illustrates a first photolithography step according to the fifth embodiment. In the first photolithography step according to the fifth embodiment, which is illustrated in FIG. 22B, first, a transparent conductive film made of an indium tin oxide is formed on a substrate 1 made of alkali free glass by sputtering. Here, the transparent conductive film may be made of an indium zinc oxide or an indium tin zinc oxide. A film thickness thereof is about 10 nm to 150 nm, and preferably, 30 to 50 nm. Subsequently, as in the case of the fourth embodiment, a signal line metal film (molybdenum) is successively formed by sputtering.

Next, a resist pattern is formed by photolithography using a half exposure mask. Here, exposure is not performed to form a thicker resist in portions in which a scanning signal line 2 and a common signal line 3 are formed, while half exposure is performed to form a thinner resist in a portion in which a common (transparent) electrode 4 is formed. After the photolithography, the signal line metal film is etched, and then the transparent conductive film is etched.

Here, the resist of the half exposure portion is stripped by plasma ashing. After the plasma ashing, the signal line metal film located in the half exposure portion is etched, thereby removing the resist. Through the step described above, the scanning signal line 2 (including a gate electrode and a scanning signal line terminal), the common signal line 3 (including a common signal line terminal), and the common (transparent) electrode 4 are formed.

Figure 23A:
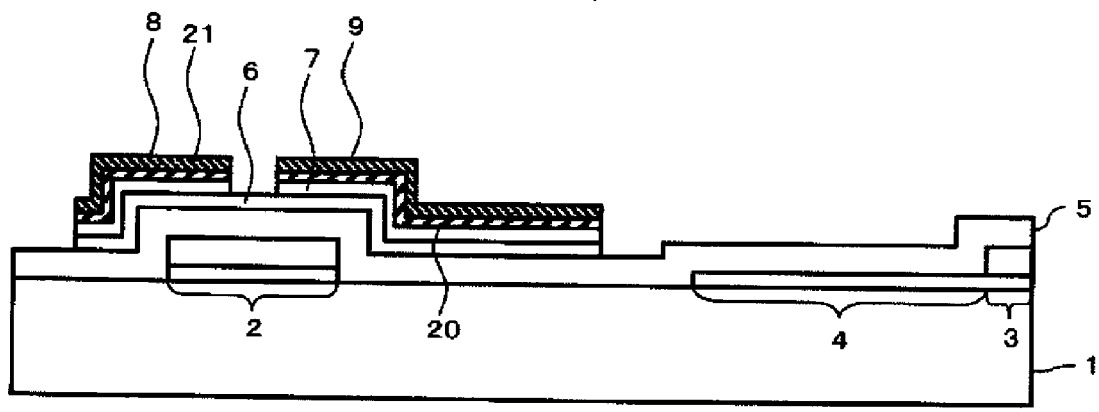
FIG. 23A is a diagram schematically illustrating a part of a cross-section of an active matrix substrate formed in a second photolithography step according to the fifth embodiment.
Figure 23B:
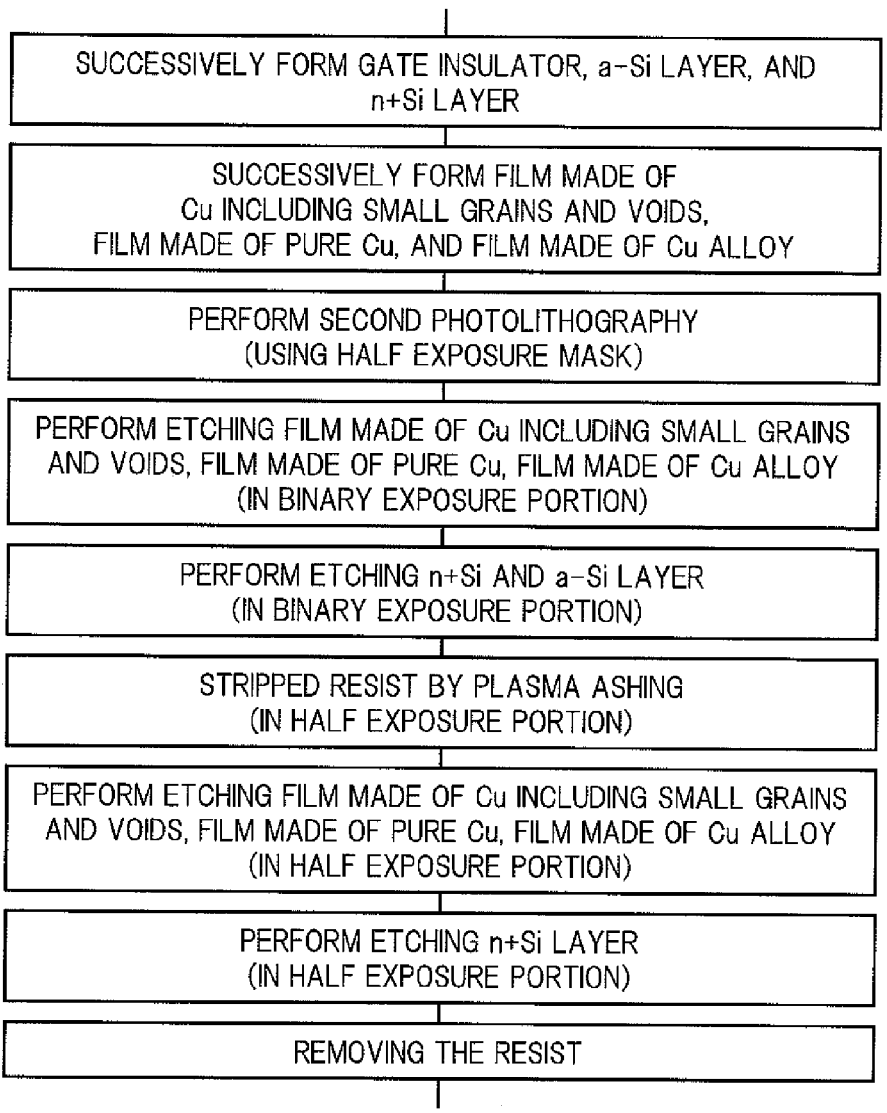
FIG. 23B is a flow chart illustrating the second photolithography step according to the fifth embodiment.

FIG. 23B illustrates a second photolithography step according to the fifth embodiment. In the second photolithography step according to the fifth embodiment, which is illustrated in FIG. 23B, first, a gate insulating film 5 made of silicon nitride, a semiconductor layer 6 made of amorphous silicon, and a contact layer 7 made of an n$^+$-type amorphous silicon are successively formed by a plasma enhanced chemical vapor deposition method.

Subsequently, a pure copper target is used to form a first layer 20. In the formation of the first layer 20, as an initial layer, mixed gas of argon and 3.5% oxygen is used from the start of the film formation, to thereby form a film made of copper including corpuscles and voids to have a film thickness of 30 nm. Then, only argon gas is used for film formation to successively form a film made of pure copper to have a film thickness of 620 nm. Further, a second film 21 made of a copper and magnesium alloy is successively formed to have a film thickness of 50 nm.

Next, a resist pattern is formed by photolithography using a half exposure mask. Here, exposure is not performed to form a thicker resist in portions in which the drain electrode 8 (including an image signal line and an image signal line terminal) and the source electrode 9 are formed, while half exposure is performed to form a thinner resist in a portion in which an island-shaped pattern of the semiconductor layer 6 is formed. After the photolithography, the laminated film including: the film made of a copper and magnesium alloy; and the film made of pure copper and copper including corpuscles and voids is etched using an etchant having pH of 6.0. Then, an n+-type amorphous silicon layer and an amorphous silicon layer are etched.

Here, a resist of a half exposure portion is stripped by plasma ashing. After the plasma ashing, the laminated film including: the film made of a copper alloy; and the film made of pure copper and copper including corpuscles and voids, and the n$^+$-type amorphous silicon layer are etched to separate a channel of a thin film transistor, whereby the resist is stripped. Through the step described above, an island-shaped pattern formed of the drain electrode 8 (including the image signal line and the image signal line terminal), the source electrode 9, and the semiconductor layer 6 is formed.

Note that the second photolithography step according to the fifth embodiment, which is illustrated in FIG. 23B, may be replaced with the step illustrated in FIG. 24B. In the second photolithography step according to the fifth embodiment, which is illustrated in FIG. 24B, first, the gate insulating film 5 made of silicon nitride, the semiconductor layer 6 made of amorphous silicon, and the contact layer 7 made of n$^+$-type amorphous silicon are successively formed by a plasma enhanced chemical vapor deposition method. Subsequently, the film made of copper including corpuscles and voids, the film made of pure copper, and the film made of a copper and magnesium alloy are successively formed.

Next, a resist pattern is formed by the photolithography using a half exposure mask. Here, the resist pattern is formed in portions in which the drain electrode 8 (including the image signal line and the image signal line terminal) and the source electrode 9 are formed. In those portions, exposure is not performed to form a thicker resist in a portion in the vicinity of the channel of the thin film transistor, while half exposure is performed to form a thinner resist in the remaining portion. After the photolithography, the laminated film including: the film made of a copper and magnesium alloy; and the film made of pure copper and copper including corpuscles and voids is etched using an etchant having pH of 6.0, whereby the drain electrode 8 (including the image signal line and the image signal line terminal) and the source electrode 9 are formed. Subsequently, the n$^+$-type amorphous silicon layer is etched, to thereby separate a channel of a thin film transistor.

Here, the resist of the half exposure portion is stripped by plasma ashing (step of removing the resist of the half exposure portion can be omitted), and the remaining resist is caused to reflow, with the result that a channel portion of the thin film transistor is filled with the resist. Subsequently, the amorphous silicon layer is etched to form an island-shaped pattern of the semiconductor layer 6.

FIG. 25B illustrates a third photolithography step according to the fifth embodiment. In the third photolithography step according to the fifth embodiment, which is illustrated in FIG. 25B, first, a protective insulating film 10 made of silicon nitride is formed by a plasma enhanced chemical vapor deposition method. The film formation is performed at about 230° C.

After the photolithography using a binary exposure mask, a through hole 11 is opened in the protective insulating film 10 located above the source electrode 9 and the image signal line terminal (not shown), and at the same time, another through hole 11 is opened in the protective insulating film 10 and the gate insulating film 5 which are located above the scanning signal line terminal (not shown), thereby removing the resist.

Figure 26B:
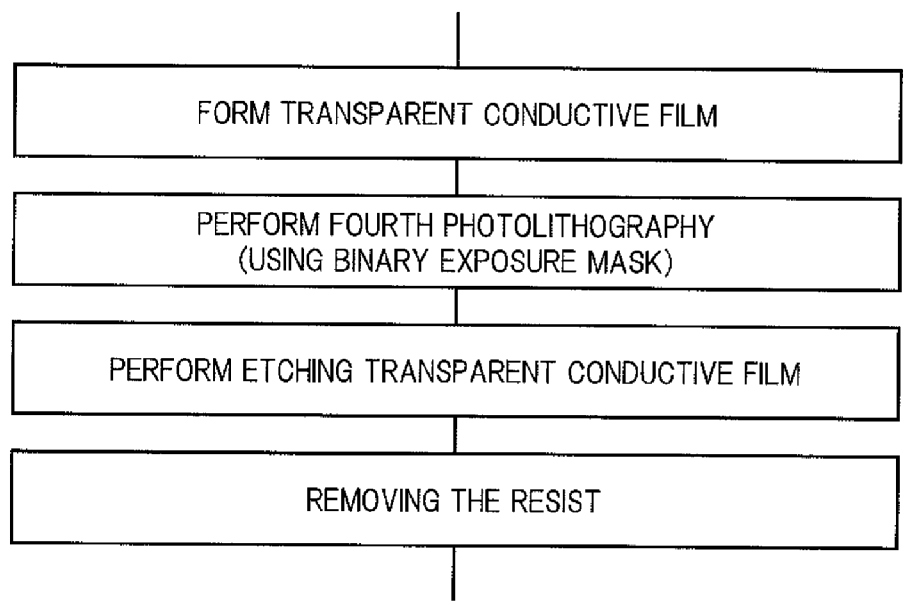
FIG. 26B is a flow chart illustrating the fourth photolithography step according to the fifth embodiment.

FIG. 26B illustrates a fourth photolithography step according to the fifth embodiment. In the fourth photolithography step according to the fifth embodiment, which is illustrated in FIG. 26B, a transparent conductive film made of an indium tin oxide is formed by sputtering.

First, after the photolithography using a binary exposure mask, patterns for a pixel electrode 12, the scanning signal line terminal (not shown), the common signal line terminal (not shown), and the image signal line terminal (not shown) are etched, thereby removing the resist. Through the step described above, an active matrix substrate of a liquid crystal display device can be manufactured even when the photolithography is performed four times.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A liquid crystal display device comprising a thin film transistor substrate which controls alignment of liquid crystal, wherein the thin film transistor substrate comprises, as a part of wiring thereof:
    a first layer formed of a copper film made of pure copper having a purity of at least 99.5%; and
    a second layer formed of an alloy film containing copper as a main component and an additive metal element and having a higher etching rate in a wet etching process compared with that of the first layer, the second layer being provided on the first layer.

2. A liquid crystal display device according to claim 1, wherein the second layer formed of the alloy film containing copper as a main component contains, as the additive metal element, a metal element which forms a metal element oxide having a higher degree of etchant solubility compared with that of a copper oxide.

3. A liquid crystal display device according to claim 2, wherein the second layer formed of the alloy film containing copper as a main component contains, as the additive metal element, at least one kind of elements selected from the group consisting of cerium, europium, hafnium, lutetium, manganese, magnesium, lead, terbium, thulium, and zinc.

4. A liquid crystal display device according to claim 3, wherein the second layer formed of the alloy film containing copper as a main component has a higher corrosion resistance compared with that of pure copper forming the first layer.

5. A liquid crystal display device according to claim 2, further comprising a transparent conductive film containing an indium oxide as a main component, the transparent conductive film being provided under the first layer,
   wherein the second layer formed of the alloy film containing copper as a main component contains, as the additive metal element, at least one kind of elements selected from the group consisting of boron, bismuth, cerium, europium, germanium, hafnium, lutetium, manganese, magnesium, lead, silicon, terbium, thulium, vanadium, and zinc.

6. A liquid crystal display device according to claim 5, wherein the second layer formed of the alloy film containing copper as a main component has a higher corrosion resistance compared with that of pure copper forming the first layer.

7. A liquid crystal display device according to claim 2, wherein the second layer formed of the alloy film containing copper as a main component contains, as the additive metal element, at least one kind of elements selected from the group consisting of aluminum, boron, beryllium, bismuth, cerium, europium, gallium, germanium, hafnium, lutetium, manganese, magnesium, lead, silicon, terbium, thulium, vanadium, and zinc.

8. A liquid crystal display device according to claim 7, wherein the second layer formed of the alloy film containing copper as a main component has a higher corrosion resistance compared with that of pure copper of the first layer.

9. A liquid crystal display device according to claim 1, wherein the second layer has a film thickness within a range of 10 nm to a value equal to or less than 10% of a film thickness of the first layer.

10. A method of manufacturing a liquid crystal display device comprising a thin film transistor substrate which controls alignment of liquid crystal, the method comprising:
    forming a first layer formed of a copper film having a purity of at least 99.5% and a second layer formed of an alloy film containing copper as a main component in a successive manner to form a laminated film, for forming a scanning signal line and a gate electrode;
    forming a film made of silicon nitride which serves as a gate insulating film, and forming a semiconductor layer by forming an amorphous silicon film and an n$^+$-amorphous silicon film in a successive manner;
    forming an image signal line, a drain electrode, and a source electrode, which are each formed of a metal film;
    forming a film made of silicon nitride serving as a protective insulating film, and opening a through hole in the protective insulating film and in the gate insulating film; and
    forming a transparent conductive film to complete a pixel electrode,
    wherein the laminated film of the first layer and the second layer is subjected to etching with an etchant having a pH in a range smaller than 7.0.

11. A method of manufacturing a in-plane-switching system liquid crystal display device comprising a thin film transistor substrate which controls alignment of liquid crystal, the method comprising:
    forming a transparent conductive film containing an indium oxide as a main component, a first layer formed of a copper film having a purity of at least 99.5%, and a second layer formed of an alloy film containing copper as a main component in a successive manner to form a laminated film, for forming a scanning signal line, a gate electrode, a common signal line, and a common electrode;
    forming a film made of silicon nitride serving as a gate insulating film, and forming a semiconductor layer by forming an amorphous silicon film and an n$^+$-amorphous silicon film in a successive manner;
    forming a metal film for forming an image signal line, a drain electrode, and a source electrode;
    forming a film made of silicon nitride serving as a protective insulating film, and opening a through hole in the protective insulating film and in the gate insulating film; and
    forming the transparent conductive film to complete a pixel electrode,
    wherein the common electrode is a base of the first layer; and
    the first layer and the second layer are subjected to etching with an etchant having a pH within a range of 1.8 to 7.0.

12. A method of manufacturing a liquid crystal display device comprising a thin film transistor substrate which controls alignment of liquid crystal, the method comprising:
    forming a first layer formed of a copper film having a purity of at least 99.5% and a second layer formed of an alloy film containing copper as a main component in a successive manner to form a laminated film, for forming a scanning signal line and a gate electrode;
    forming a film made of silicon nitride which serves as a gate insulating film, and forming a semiconductor layer by forming an amorphous silicon film and an n$^+$-amorphous silicon film in a successive manner;
    forming a metal film for forming an image signal line, a drain electrode, and a source electrode;
    forming a film made of silicon nitride which serves as a protective insulating film, and opening a through hole in the protective insulating film and in the gate insulating film; and
    forming a transparent conductive film to complete a pixel electrode,
    wherein the laminated film of the first layer and the second layer is subjected to etching with an etchant having a pH within a range of 7.0 to 14.0.

* * * * *